US011635688B2

(12) United States Patent
Nawrocki et al.

(10) Patent No.: US 11,635,688 B2
(45) Date of Patent: Apr. 25, 2023

(54) PHOTOIMAGEABLE COMPOSITIONS AND PROCESSES FOR FABRICATION OF RELIEF PATTERNS ON LOW SURFACE ENERGY SUBSTRATES

(71) Applicant: KAYAKU ADVANCED MATERIALS, INC., Westborough, MA (US)

(72) Inventors: Daniel J. Nawrocki, Chicopee, MA (US); Jeremy V. Golden, Burlington, MA (US); Milton O. Bernal, East Providence, RI (US); William D. Weber, East Providence, RI (US)

(73) Assignee: KAYAKU ADVANCED MATERIALS, INC., Westborough, MA (US)

( * ) Notice: Subject to any disclaimer, the term of this patent is extended or adjusted under 35 U.S.C. 154(b) by 0 days.

(21) Appl. No.: 14/380,871

(22) PCT Filed: Mar. 4, 2013

(86) PCT No.: PCT/US2013/028827
§ 371 (c)(1),
(2) Date: Aug. 25, 2014

(87) PCT Pub. No.: WO2013/134104
PCT Pub. Date: Sep. 12, 2013

(65) Prior Publication Data
US 2015/0024326 A1 Jan. 22, 2015

Related U.S. Application Data

(60) Provisional application No. 61/634,937, filed on Mar. 8, 2012.

(51) Int. Cl.
*G03F 7/004* (2006.01)
*G03F 7/40* (2006.01)
*G03F 7/11* (2006.01)
*G03F 7/038* (2006.01)
*G03F 7/039* (2006.01)
*G03F 7/07* (2006.01)
*G03F 7/029* (2006.01)
*G03F 7/031* (2006.01)
*G03F 7/027* (2006.01)
*G03F 7/075* (2006.01)

(52) U.S. Cl.
CPC .......... *G03F 7/0385* (2013.01); *G03F 7/0045* (2013.01); *G03F 7/0046* (2013.01); *G03F 7/027* (2013.01); *G03F 7/029* (2013.01); *G03F 7/031* (2013.01); *G03F 7/038* (2013.01); *G03F 7/0392* (2013.01); *G03F 7/0751* (2013.01); *G03F 7/11* (2013.01); *G03F 7/40* (2013.01)

(58) Field of Classification Search
CPC ...... G03F 7/0045; G03F 7/0046; G03F 7/027; G03F 7/029; G03F 7/031; G03F 7/40; G03F 7/038; G03F 7/039; G03F 7/057; G03F 7/11
See application file for complete search history.

(56) References Cited

U.S. PATENT DOCUMENTS

| | | | |
|---|---|---|---|
| 4,189,323 A | 2/1980 | Buhr | |
| 4,246,298 A | 1/1981 | Guarney et al. | |
| 4,250,203 A | 2/1981 | Schlesinger et al. | |
| 4,366,228 A | 12/1982 | Specht et al. | |
| 4,491,628 A | 1/1985 | Ito et al. | |
| 4,548,891 A | 10/1985 | Riediker et al. | |
| 4,565,859 A | 1/1986 | Murai et al. | |
| 4,841,017 A | 6/1989 | Murai et al. | |
| 4,874,798 A | 10/1989 | Koleske et al. | |
| 4,961,976 A | 10/1990 | Hashimoto et al. | |
| 4,980,268 A | 12/1990 | Bartmann et al. | |
| 5,019,482 A | 5/1991 | Ai et al. | |
| 5,049,628 A | 9/1991 | Nawata et al. | |
| 5,215,863 A | 6/1993 | Nawata et al. | |
| 5,300,402 A | 4/1994 | Card, Jr. et al. | |
| 5,344,742 A | 9/1994 | Sinta et al. | |
| 5,362,607 A * | 11/1994 | Crivello | G03F 7/0045 430/176 |

(Continued)

FOREIGN PATENT DOCUMENTS

| | | |
|---|---|---|
| CN | 1934498 A | 3/2007 |
| EP | 0164248 A2 | 12/1985 |

(Continued)

OTHER PUBLICATIONS

Machine translation of KR 2009019621 (2009).*
International Preliminary Report on Patentability and Written Opinion of the International Searching Authority of International Application No. PCT/US2013/028827; Intl Filing Date: Mar. 4, 2013; dated May 21, 2015; 11 Pages.
Bekhli et al., "Fluorine-Containing Compounds Improvising Adhesion of Epoxy Oligomers to Materials with Low Surface Energy" Polymer Science; vol. 49; No. 3; (2007); pp. 264-268.
CN1934498 A English Abstract; Date of Publication: Mar. 21, 2007; 1 page.

(Continued)

Primary Examiner — Martin J Angebrannndt
(74) Attorney, Agent, or Firm — Cantor Colburn LLP

(57) ABSTRACT

The present invention is directed to a permanent photoimageable compositions and the cured products thereof useful for making negative-tone, permanent photoresist relief patterns on low surface energy polymer substrates, comprising: (A) one or more alkali soluble, film forming resins or one or more film forming resins that become soluble in alkali solutions by action of an acid, (B) one or more cationic photoinitiators, (C) one or more film casting solvents, and (D) one or more fluorinated compounds. The present invention is also directed to methods of forming a permanent photoresist relief pattern on a low surface energy polymer substrate using the disclosed compositions.

28 Claims, 3 Drawing Sheets

(56) References Cited

U.S. PATENT DOCUMENTS

| | | | |
|---|---|---|---|
| 5,395,862 A | 3/1995 | Neckers et al. | |
| 5,403,437 A * | 4/1995 | Beratan | G03F 7/0046 216/49 |
| 5,451,343 A | 9/1995 | Neckers et al. | |
| 5,492,793 A | 2/1996 | Breyta et al. | |
| 5,494,698 A * | 2/1996 | White | B05D 1/18 347/20 |
| 5,538,821 A | 7/1996 | Kakinuma et al. | |
| 5,545,702 A | 8/1996 | Oishi et al. | |
| 5,656,336 A | 8/1997 | Kamen et al. | |
| 5,837,420 A * | 11/1998 | Aoai | G03F 7/0045 430/270.1 |
| 6,042,997 A | 3/2000 | Barclay et al. | |
| 6,066,889 A | 5/2000 | Jones et al. | |
| 6,110,640 A * | 8/2000 | Kawamura et al. | 430/270.1 |
| 6,284,185 B1 | 9/2001 | Tokuda et al. | |
| 6,294,239 B1 | 9/2001 | Tokuda et al. | |
| 6,524,708 B2 | 2/2003 | Puligadda et al. | |
| 6,730,452 B2 | 5/2004 | Brock et al. | |
| 6,824,948 B1 * | 11/2004 | Aoai | G03F 7/038 430/170 |
| 7,055,938 B1 | 6/2006 | Ohkuma et al. | |
| 7,282,324 B2 | 10/2007 | Weber et al. | |
| 7,358,027 B2 | 4/2008 | Ito et al. | |
| 7,359,108 B2 | 4/2008 | Hayes et al. | |
| 7,479,364 B2 | 1/2009 | Ito | |
| 7,800,816 B2 | 9/2010 | Hayes et al. | |
| 7,813,030 B2 | 9/2010 | Lo et al. | |
| 8,232,235 B2 | 7/2012 | Owens | |
| 8,552,083 B1 | 10/2013 | Taranekar et al. | |
| 2001/0018162 A1 * | 8/2001 | Hatakeyama | C08F 20/22 430/270.1 |
| 2003/0068486 A1 | 4/2003 | Arney et al. | |
| 2003/0152864 A1 * | 8/2003 | Araki | G03F 7/0045 430/270.1 |
| 2003/0176583 A1 * | 9/2003 | Rhodes | C08G 61/06 525/326.2 |
| 2004/0017451 A1 | 1/2004 | Takabayashi | |
| 2004/0072097 A1 * | 4/2004 | Kodama | 430/270.1 |
| 2004/0142272 A1 * | 7/2004 | Song | G03F 7/027 430/176 |
| 2004/0180287 A1 | 9/2004 | Feiring et al. | |
| 2005/0191580 A1 * | 9/2005 | Takahashi | G03F 7/0046 430/270.1 |
| 2005/0260522 A1 * | 11/2005 | Weber et al. | 430/270.1 |
| 2005/0265685 A1 | 12/2005 | Ohashi et al. | |
| 2005/0266335 A1 | 12/2005 | Johnson et al. | |
| 2006/0063102 A1 * | 3/2006 | Kubota et al. | 430/270.1 |
| 2006/0223001 A1 * | 10/2006 | Nishimura | G03F 7/0757 430/270.1 |
| 2006/0255009 A1 * | 11/2006 | Card et al. | 216/13 |
| 2006/0257785 A1 | 11/2006 | Johnson | |
| 2007/0172761 A1 | 7/2007 | Takahashi et al. | |
| 2007/0225458 A1 * | 9/2007 | Kimura | C07C 25/18 526/179 |
| 2007/0243662 A1 | 10/2007 | Johnson et al. | |
| 2008/0124654 A1 * | 5/2008 | Park et al. | 430/281.1 |
| 2008/0160432 A1 * | 7/2008 | Byon et al. | 430/7 |
| 2008/0213549 A1 | 9/2008 | Lee et al. | |
| 2008/0299487 A1 | 12/2008 | Chang | |
| 2009/0011367 A1 | 1/2009 | Omatsu et al. | |
| 2009/0061364 A1 | 5/2009 | Teng | |
| 2009/0130594 A1 | 5/2009 | Takei et al. | |
| 2009/0233225 A1 | 9/2009 | Johnson et al. | |
| 2010/0233626 A1 | 9/2010 | Shimizu et al. | |
| 2010/0285227 A1 | 11/2010 | Yapel et al. | |
| 2011/0065620 A1 | 3/2011 | Owens | |
| 2011/0102528 A1 * | 5/2011 | Tsuchimura | C07C 311/48 347/102 |
| 2011/0104389 A1 | 5/2011 | Bryan-Brown et al. | |
| 2011/0123936 A1 * | 5/2011 | Hori | H01L 21/0273 430/324 |
| 2011/0159252 A1 | 6/2011 | Ober et al. | |
| 2012/0187548 A1 * | 7/2012 | Kugler | C08J 7/042 257/632 |
| 2012/0206068 A1 * | 8/2012 | Sone | H01L 21/76802 315/362 |
| 2013/0172476 A1 * | 7/2013 | Sasamoto | C09D 11/101 524/544 |
| 2014/0302430 A1 * | 10/2014 | Nawrocki et al. | 430/18 |

FOREIGN PATENT DOCUMENTS

| | | | | |
|---|---|---|---|---|
| EP | 0232972 A2 | | 8/1987 | |
| JP | 02-259762 | * | 10/1990 | |
| JP | 2000089455 A | | 3/2000 | |
| JP | 2003-105207 | * | 4/2003 | |
| JP | 2003-255523 | * | 9/2003 | |
| JP | 2003-287890 | * | 10/2003 | |
| JP | 2005-140849 | * | 6/2005 | |
| JP | 2008026696 A | | 2/2008 | |
| JP | 2009265449 A | | 11/2009 | |
| JP | 2010032991 A | | 2/2010 | |
| JP | 2010276694 A | | 12/2010 | |
| KR | 2009019621 | * | 2/2009 | G03F 7/0007 |
| WO | 2010128969 A1 | | 11/2010 | |
| WO | 2011027782 A1 | | 10/2011 | |
| WO | 2012173721 A1 | | 12/2012 | |
| WO | 2013/036502 | * | 3/2013 | |

OTHER PUBLICATIONS

International Preliminary Report on Patentability and Written Opinion for International Patent Application No. PCT/US2012/053738; International Filing Date: Sep. 5, 2012; Date of completion Oct. 12, 2012, 6 Pages.

International Search Report From the International Searching Authority for International Application No. PCT/US2012/053738; International Filing Date: Sep. 5, 2012; dated Nov. 23, 2012; 1 Page.

Onishi et al., "Acid catalyzed Resist for KrF Excimer Laser Lithography" Journal of Photopolymer Science and Technology, vol. 4, No. 3, (1991), pp. 337-340.

Supplemental European Search Report for European Patent Application No. 12829584.7; Date of Filing: Sep. 5, 2012; Date of Compeltion Jan. 26, 2015; 10 Pages.

Wang et al. "Piezoelectric Inkjet Technology, From Graphic Printing to Material Deposition" FUJIFILM Dimatix, Inc., Nanotech Conference & Expo, May 3-7, 2009. 24 Pages.

Zhou et al., "A Full Description of a Simple and Scalable Fabrication Process for Electrowetting Displays" Journal of Micromechanics and Microengineering, vol. 19, (2009), 12 Pages.

JP 2000-89455 A, Published Mar. 31, 2000; English Abstract Only, 1 page.

"3M Novec 7200 Engineered Fluid", 3M, searched on Jan. 25, 2017, Internet, http://multimedia.3m.com/mws/media/1998190/3mtm-novectm-7200-engineered-fluid.pdf.

International Search Report issued in Application No. PCT/US2013/028827 dated May 8, 2013.

* cited by examiner

PHOTOIMAGEABLE COMPOSITIONS AND PROCESSES FOR FABRICATION OF RELIEF PATTERNS ON LOW SURFACE ENERGY SUBSTRATES

CROSS-REFERENCE TO RELATED APPLICATIONS

This Application is a U.S. National Stage Application of PCT/US2013/028827 filed Mar. 4, 2013 which claims priority to U.S. Provisional Application No. 61/634,937 filed Mar. 8, 2012, both of which are incorporated by reference in their entirety.

BACKGROUND OF THE INVENTION

Field of the Invention

The present invention is directed to permanent, photoimageable compositions and methods for their use in the fabrication of relief structures on low surface energy substrates.

Brief Description of the Related Art

Photoimageable coatings are currently used in a wide variety of micro-electromechanical systems (MEMs) technologies and applications. Microfluidics is the branch of MEMs technology that deals with the behavior, precise control and manipulation of small volumes of fluid that are geometrically constrained in small volume elements on the order of $10^{-9}$ to $10^{-15}$ liters. Microfluidics emerged as a technical discipline in the early 1980s and has found application in the fabrication of inkjet print heads, DNA sequencing chips, lab-on-a-chip technology, micro-propulsion, adaptive lenses, pixelated optical filters, and recently, display technologies for computer and mobile device applications.

The electrowetting effect provides the basis for several microfluidic device designs and concepts. The electrowetting effect is defined as the change in a solid-electrolyte solution contact angle due to the application of an applied electrical potential or voltage between the solid and the electrolyte. As an example, a water droplet resting on a hydrophobic insulator film exhibits a large contact angle due to surface tension mismatch. If the hydrophobic insulator film is positioned on top of and in contact with an electrode and then the water droplet is contacted with a separate electrode, then the contact angle of the water droplet with the hydrophobic surface will decrease when an electrical potential is applied between the two electrodes and the water droplet spreads to cover a larger area of the hydrophobic film surface. The electrowetting effect is reversible and thus upon removal of the applied electrical potential, the water droplet contact angle returns to the unbiased value.

The electrowetting effect has been elaborated into microfluidic optical switches that form the operating basis for electrowetting display devices as disclosed in U.S. Pat. Nos. 7,813,030, 7,359,108, and 7,800,816. The pixel elements of these prior art display devices each comprise a microfluidic optical switch constructed as shown in FIGS. 1a and 1b (redrawn from FIG. 1a and FIG. 1b in U.S. Pat. No. 7,800,816).

FIG. 1 shows a diagrammatic cross-section of a display device pixel element 1 which shows the principle on which an electrowetting display device is based. Between two transparent substrates or support plates 3 and 4 which may be glass or plastic, a first fluid 5 and a second fluid 6 are provided, which are immiscible with each other. For instance, the first fluid 5 may be an alkane like hexadecane or colored oil. The second fluid 6 is electroconductive or polar and may be water or a salt solution. In the device off state, when no external voltage is applied (FIG. 1a), the fluids 5 and 6 adjoin the first and second transparent support plates 3 and 4. On the first support plate 3 a transparent electrode 7, for example indium (tin) oxide, is provided and an intermediate less wettable (hydrophobic) layer 8, for example an amorphous fluoropolymer, is provided as a coating on transparent electrode 7.

When a voltage is applied (voltage source 9) via interconnections 20 and 21 the layer of fluid 5 moves aside or breaks up into small droplets (FIG. 1b, on state). This occurs when the electrostatic energy gain is larger than the surface energy loss due to the creation of curved surfaces. As a very important aspect, it was found that reversible switching between a continuous film of fluid 5 covering the support plate 3 and a film of fluid 5 adjoining the pixel wall 2 is achieved by means of the electrical switching means (voltage source 9).

Optical switching is obtained when light incident on the devices according to FIG. 1 is reflected from reflector 10 as in FIG. 1b to provide reflected light 12. In the device off state according to FIG. 1b, the incident light is not reflected and the pixel appears dark to an observer.

Negative-tone, photosensitive epoxy coating compositions such as SU-8, a product of MicroChem Corp., have found utility as a material for fabricating electrowettable display pixel sidewalls (2 in FIG. 1a) as described in Heikenfeld, J., et. al., *J. Micromech. Microeng.*, 19 (2009) pp 1-12. In order to fabricate pixel side walls, the photosensitive epoxy composition must be coated on the hydrophobic layer (7 in FIG. 1a). In most electrowettable display implementations, the hydrophobic layer is a low surface energy polymer and fluoropolymers are commonly used. Consequently, it is difficult to form coatings of solvent-cast photosensitive epoxy compositions on such low surface energy substrates due to the large mismatch in surface energy between the epoxy composition and the hydrophobic substrate which leads to coating defects and poor coating adhesion. This problem has been mitigated by treating the hydrophobic layer using methods such as corona discharge, UV-ozone, or oxygen reactive ion etch that increase the surface energy of the hydrophobic layer and thus provide an activated surface to promote wetting and adhesion of the photoepoxy composition. A consequence of such treatments is that the surface energy of the activated hydrophobic layer must be reduced to restore the surface energy of the hydrophobic layer to a value that permits proper function of the electrowetting device. This may be accomplished by baking the hydrophobic layer at an elevated temperature. It should be noted that the bake temperature may be constrained by the characteristics of the transparent support plate 3 which in the case of plastics such as polyethylene terephthalate and polyethylene naphthalate, constrain the bake temperature to values less than the deformation temperature of such plastic support plate materials.

The process steps of hydrophobic layer activation and subsequent annealing results in increased process complexity and cost. Accordingly, there exists a need for photoimageable film forming compositions whose processing on hydrophobic layers does not require the use of hydrophobic layer surface activation methods. Owing to the higher cost of ownership of processes using organic solvents, in terms of both the solvent cost and waste disposal, additional process cost savings can be obtained by using aqueous alkali solutions rather than organic solvents to develop the relief pattern. It is therefore an object of the present invention to provide photoimageable film forming compositions that may be coated on non-activated hydrophobic surfaces and processed using aqueous alkali solutions thus eliminating the need for hydrophobic layer activation while also providing the process economies that result from the use of aqueous alkali solutions to develop a relief pattern.

SUMMARY OF THE INVENTION

The present invention relates to permanent photoimageable compositions and the permanent cured products thereof that are useful in the fabrication of MEMS (micro-electromechanical system) components, micromachine components, μ-TAS (micro-total analytical system) components, microreactor components, dielectric layers, electrowetting microfluidic devices, and the like that are capable of being patterned using ultraviolet lithographic methods wherein the photoresist relief structure is formed on a low surface energy polymer substrate. The invention further relates to photoimageable compositions wherein the relief pattern is formed using aqueous alkali developer solutions. The invention further relates to permanent photoimageable compositions and the cured products thereof in which the cured product has high strength, excellent adhesion, resistance to cracking and crazing, excellent chemical resistance to acids, bases, and solvents, good heat resistance, and good electrical properties.

Therefore, one aspect of the present invention is directed to providing permanent photoimageable compositions useful for making permanent photoresist relief patterns on low surface energy polymer substrates comprising:
  (i) one or more alkali soluble, film-forming resins (A) or one or more film forming resins that become soluble in alkali solutions by action of an acid (B); and
  (ii)) a cationic photoinitiator (C) and/or a radical photoinitiator (D); and
  (iii) one or more film casting solvents (E); and
  (iv) one or more fluorinated compounds (F).

In addition to components (A) through (F) inclusively, the compositions according to the invention may in certain embodiments further comprise one or more cross linking compounds or resins (G). In addition to components (A) through (G) inclusively, the compositions according to the invention may optionally comprise one or more of the following additive materials: one or more surfactants (H); one or more optional resins (I); one or more photosensitizers (J); one or more adhesion promoters (K); one or more light absorbing compounds including dyes and pigments (L), and one or more flexibilizing compounds (M). In addition to components (A) through (M) inclusively, the compositions according to the invention can also optionally comprise additional materials including, without limitation, flow control agents, thermoplastic and thermosetting organic polymers and resins, and inorganic filler materials.

Another aspect of the present invention is directed to a method of forming a permanent photoresist relief pattern on a low surface energy polymer substrate comprising the process steps of: (1) providing a low surface energy polymer layer on a substrate by coating a low surface energy polymer solution on the substrate, (2) forming a layer of any of the photoresist compositions according to the invention on the low surface energy polymer substrate; (3) evaporating most of the solvent from the photoresist layer by heating the coated substrate to form a film of the photoresist composition on the substrate; (4) irradiating the photoresist film with active rays through a mask; (5) further heating the irradiated photoresist film segments; (6) developing the mask image in the photoresist film with an aqueous alkali solution to form a relief image of the mask in the photoresist film; and (7) optionally heat-treating the photoresist relief structure to further cure the photoresist and low surface energy polymer layers.

Still another aspect of the present invention is directed to providing a photoresist relief structure on a low surface energy polymer substrate wherein the substrate areas not covered by the photoresist relief pattern retain the hydrophobic surface activity needed for the successful operation of electrowetting devices.

BRIEF DESCRIPTION OF THE FIGURES

The following description of the invention will be better understood when taken in conjunction with the following figures wherein:

FIG. 2b shows a higher magnification view of the pixel wall pattern shown in FIG. 2a.

DETAILED DESCRIPTION OF THE INVENTION

Figure 1A:
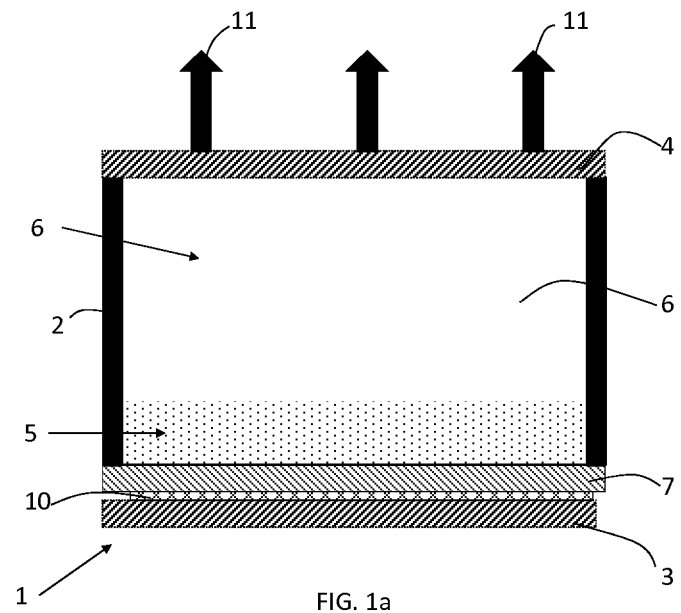
FIG. 1a depicts a schematic cross section of an electrowettable display pixel element of the prior art in the off-state.
Figure 1B:
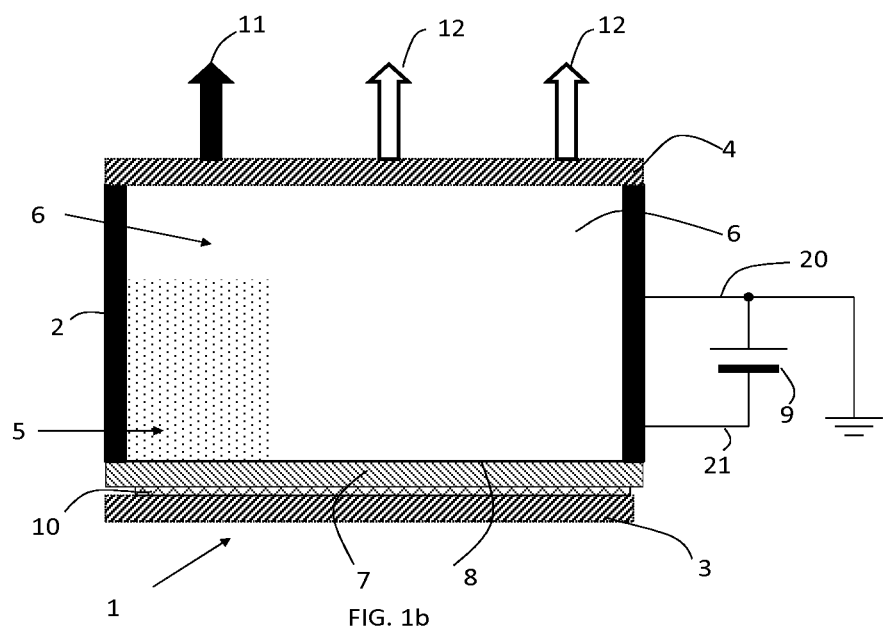
FIG. 1b depicts a schematic cross section of an electrowettable display pixel element of the prior art in the on-state.

In the art related to photoimageable compositions, photoresists are generally understood to be temporary coatings that are used to selectively protect one area of a substrate from another such that the operation of a subsequent process takes place only in an area of the substrate that is not covered by the photoresist. Once this subsequent operation has been completed, the photoresist is removed. Thus, the properties of such temporary photoresist coatings need be only those required to obtain the required image profile and be resistant to the action of the subsequent process steps. However, the present invention addresses applications wherein the photoresist layer is not removed and is used as a permanent structural component of the device being fabricated. In the case of use of the photoresist as a permanent layer, the material properties of the photoresist film must be compatible with the intended function and end use of the device. Therefore, photoimageable layers that remain as a permanent part of the device are termed herein as permanent photoresists.

The permanent photoresist compositions of the present invention are comprised of: one or more alkali soluble, film-forming resins (A) or one or more film forming resins that become soluble in alkali solutions by action of an acid (B); a cationic photoinitiator (C) and/or a radical photoinitiator (D); one or more film casting solvents (E); and one or more fluorinated compounds (F). In certain embodiments, the compositions of the invention may further comprise a cross linking compound or resin (G). In addition to components (A) through (G) inclusively, the compositions according to the invention may optionally comprise one or more of the following additive materials: one or more surfactants (H); one or more optional resins (I); one or more photosensitizers (L); one or more adhesion promoters (K); one or more light absorbing compounds including dyes and pigments (L), and one or more flexibilizing compounds (M). In addition to components (A) through (M) inclusively, the compositions according to the invention can also optionally comprise additional materials including, without limitation, flow control agents, thermoplastic and thermosetting organic polymers and resins, and inorganic filler materials.

The permanent photoresist compositions according to the invention may be of either the negative tone or positive tone type. Negative tone compositions comprise an alkali soluble resin (A) that is rendered insoluble in aqueous alkali solution by cross linking reactions initiated by either cationic photoinitiators (C) and/or free radical photoinitiators (D). In this instance, regions of the film exposed to patterned radiation of an appropriate wavelength are cross linked and rendered insoluble and thus provide a negative tone relief image of the pattern following treatment of the imaged film with an aqueous alkali developer solution. Positive tone compositions comprise an alkali insoluble resin (B) that is rendered soluble in aqueous alkali solutions by acid catalyzed reactions initiated by a cationic photoinitiator (C) that result in the removal of a chemical moiety yielding a resin product that is soluble in aqueous alkali solutions. In this instance, regions of the film exposed to patterned radiation of an appropriate wavelength are soluble and thus provide a positive tone relief image of the pattern following treatment of the imaged film with an aqueous alkali developer solution.

There are no special restrictions with respect to the structure to the alkali-soluble resin (A) that is used in the negative-tone, permanent photoresist compositions of the present invention as long as it is capable of imparting to the resin composition the ability to be developed (solubility) in an aqueous alkali solution. Examples of alkali soluble, film-forming resin component (A) useful in negative tone compositions include phenol novolac resins, ortho-cresol novolac resins, para-cresol novolac resins, ortho, para-cresol novolac resins, bisphenol novolac resins, copolymers of ethylenic unsaturated resins such as acrylic acid esters, polyester resins synthesized from polyhydric alcohols and polybasic acid compounds, and the reaction products of epoxy resins, monocarboxylic acids, and polybasic acid anhydrides.

In terms of solubility in an aqueous alkali solution, a compound having one or more carboxyl groups per molecule is preferred, and the product obtained when the reaction product of an epoxy resin (a) and a monocarboxylic acid (b) is further reacted with a polybasic acid or anhydride (c) is more preferred. Examples of epoxy resins (a) that may be used as starting materials in the preparation of the alkali-soluble resin (A) are novolac epoxy resins, bisphenol epoxy resins, biphenyl epoxy resins, triphenylmethane epoxy resins, and phenolaralkyl epoxy resins. Specific examples of epoxy resin (a) include, but are not limited to, the glycidates of bisphenol A, bisphenol F, bisphenol S, bisphenol Z, bisphenol AF, thiodiphenol, fluorene bisphenol, terpene diphenol, 4,4'-biphenol, 2,2'-biphenol, 3,3',5,5'-tetramethyl-[1,1'-biphenyl]-4,4'-diol, hydroquinone, resorcinol, naphthalenediol, tris-(4-hydroxyphenyl)methane, 1,1,2,2,-tetrakis(4-hydroxyphenyl)ethane, epoxy resins derived from the polycondensates of a phenol (phenol, alkyl-substituted phenol, naphthol, alkyl-substituted naphthol, dihydroxybenzene, or dihydroxynaphthalene) and formaldehyde, acetaldehyde, benzaldehyde, p-hydroxybenzaldehyde, o-hydroxybenzaldehyde, p-hydroxyacetophenone, o-hydroxyacetophenone, dicyclopentadiene, furfural, 4,4'-bis (chloromethyl)-1,1'-biphenyl, 4,4'-bis(methoxymethyl)-1,1'-biphenyl, 1,4-bis(chloromethyl)benzene or 1,4-bis (methoxymethyl)benzene or modified products thereof, halogenated bisphenols such as tetrabromobisphenol A, glycidyl ether compounds derived from alcohols, and solid or liquid epoxy resins such as alicyclic epoxy resins. Examples of the monocarboxylic acids (b) that may be used in the preparation of an alkali-soluble, film-forming resin (A) include, but are not limited to, ethylenic unsaturated monocarboxylic acids such as acrylic acid, methacrylic acid, crotonic acid, cinnamic acid, acrylic acid dimer, mono- and di-hydroxyl group containing monocarboxylic acids such as dimethylolpropionic acid, dimethylolacetic acid, dimethylolbutyric acid, dimethylolvaleric acid, and dimethylolcaproic acid, and monohydroxy-containing monocarboxylic acids, such as hydroxypivalic acid, and p-hydroxybenzoic acid. Examples of dibasic acids and anhydrides (c) that may be used in the preparation of an alkali-soluble, film-forming resin (A) are dibasic acids, such as succinic acid, maleic acid, phthalic acid, tetrahydrophthalic acid, hexahydrophthalic acid, methylhexahydrophthalic acid, methyl-endomethylene tetrahydrophthalic acid, trimellitic acid, and pyromellitic acid, and the anhydrides of these dibasic acids.

Epoxy resins (a) that are particularly preferred as starting materials are resins that show less discoloration after heating because such resins provide films of high optical transparency which are desirable in certain practical applications such as displays. In this aspect, particularly preferred epoxy resins (a) are bisphenol A formaldehyde epoxy resins or an epoxy resin in which the primary component is an epoxy resin represented by Formula 1 or Formula 2.

Formula 1

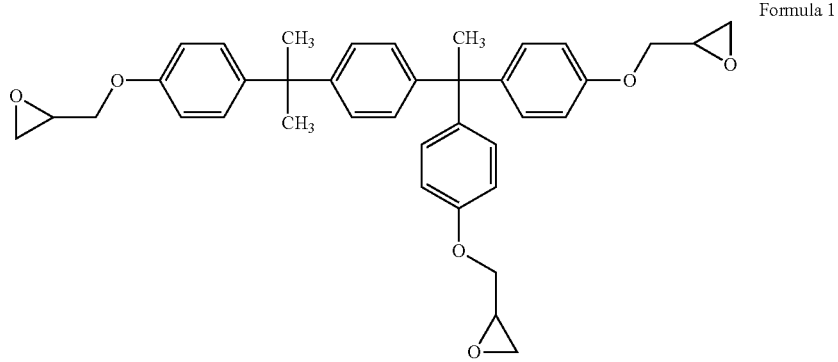

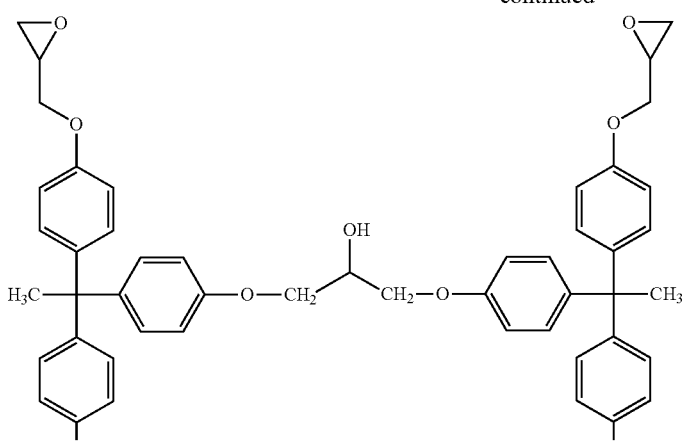
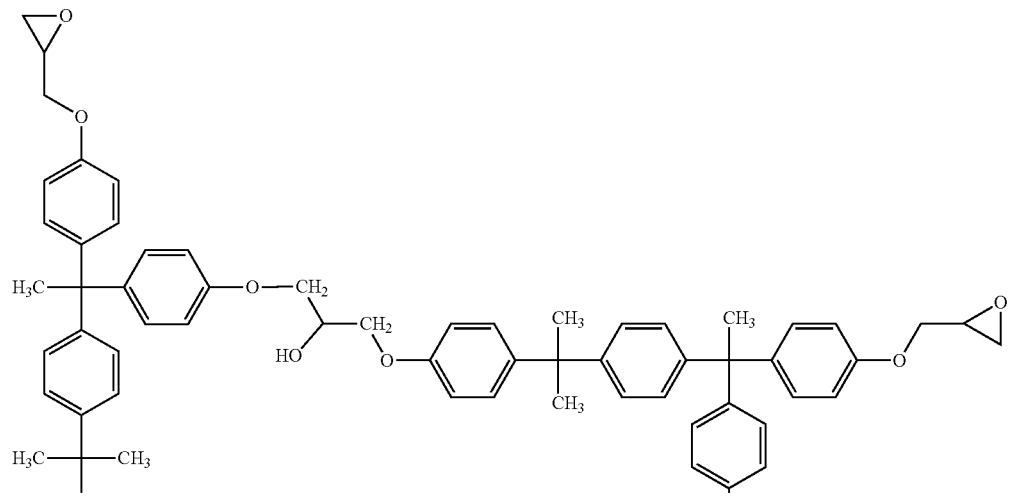
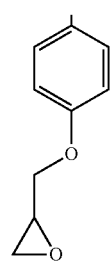

Formula 2

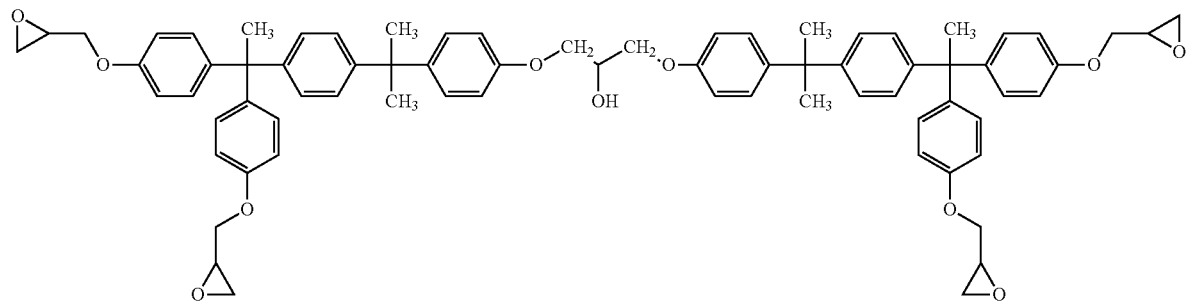

By means of an esterification reaction between the epoxy resin (a) and a monocarboxylic acid (b), the monocarboxylic acid (b) is reacted, preferably in an amount that is approximately 0.1 to 1.5 molar equivalents per molar equivalent of epoxy groups in epoxy resin (a). It is preferred that the reaction is performed in the presence of a diluent in the form of a solvent such as methyl ethyl ketone, methyl isobutyl ketone, cyclopentanone, ethyl cellosolve acetate, butyl cellosolve acetate, carbitol acetate, diethylene glycol dimethyl ether, and solvent naphtha. Furthermore, preferably the reaction is promoted by using a catalyst such as triethylamine, benzyldimethylamine, tetramethylammonium chloride, methyltriethylammonium chloride, triphenyl stibine, and triphenyl phosphine. The amount of this catalyst, in terms of the reaction starting material mixture, is preferably 0.01 to 10% by weight, and more preferably 0.05 to 5% by weight. Preferably, polymerization during the reaction is prevented by using a polymerization inhibitor (such as methoquinone, hydroquinone, dibutylhydroxytoluene, or phenothiazine). The amount of polymerization inhibitor used, in terms of the reaction starting material mixture, is preferably 0.01 to 2% by weight, particularly preferably 0.05 to 1% by weight. The reaction temperature is usually from 60 to about 150° C., and the reaction time is usually from about 5 to about 50 hours.

An alkali-soluble, film-forming resin (A) formed from epoxy resin (a), monocarboxylic acid (b), and a polybasic acid or anhydride thereof (c) is obtained by reacting preferably 0.05 to 1.00 molar equivalent of the polybasic acid or anhydride thereof (c) per molar equivalent of hydroxyl groups in terms of hydroxyl groups in the reaction product of epoxy resin (a) and monocarboxylic acid (b). The reaction temperature is from about 60 to about 160° C.

The resulting alkali-soluble film forming resin (A) preferably has an acid value (mg KOH/g) of from about 30 to about 160 and more preferably from about 50 to about 150.

A preferred and specific example of an alkali soluble film forming resin (A) is a resin termed NC 6300 EATA (Nippon Kayaku Company) which is the reaction product formed from the tetramethylammonium chloride catalyzed esterification of the epoxy resins (i.e., a) of Formulas 1 and 2 with acrylic acid (b) followed by further esterification with tetrahydrophthalic anhydride (c) in methyl isobutyl ketone solvent. Additional examples of suitable alkali soluble resins (A) formed from epoxy resins (a), monocarboxylic acid (b), and a polybasic acid or anhydride thereof (c) are described in U.S. Pat. Nos. 5,049,628, 5,215,863, 5,538,821, 6,284,185, 6,294,239, and 7,282,324. The base soluble resins described by Formulas 1B and 1C in U.S. Pat. No. 7,282,324 are other specific examples of resins (A) that may be used and a resin corresponding to Formula 1B is designated as BMR resin in Table 1 of the instant application.

Another group of resins suitable for use as an alkali soluble, film forming resin (A) are the bisphenol novolac resins according to Formula 3 wherein groups $R_1$ and $R_2$ are independently, hydrogen, $C_1$ to $C_6$ alkyl, $C_6$ to $C_{14}$ aryl or aralkyl, $C_1$ to $C_6$ perfluoroalkyl, or wherein $R_1$ and $R_2$ combine to form a $C_5$ to $C_{14}$ alicyclic or aralkylcyclic ring. In Formula 3, n is an integer with values ranging from about 15 to about 100.

Formula 3

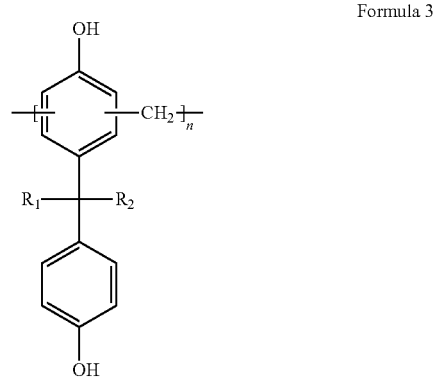

Still another group of alkali soluble film forming resins (A) are the polyhydroxy novolac resins 1 resins described by Formula 4. In Formula 4, x is an integer greater than about 15 and less than about 100 and R may represent hydrogen or an alkyl group of 1 to 6 carbon atoms Examples of polyhydroxy novolac resins include, but are not limited to, Durite® SD-1708, SL-1710, SD-1502, SD-1702, SD-1731, SD-1734, SD-241A, SD-423A, RD-2414, SD-5132, SD-7280, SD-1502, SD-500C, available from the Borden Chemical Company; GP-2074, 5300, 5833, 834D54, available from Georgia Pacific; HRJ-11040, 1166, 1583, 45 2210, 2355, 2901, CRJ-406, and FRJ-425/200, available from Schenectady International.

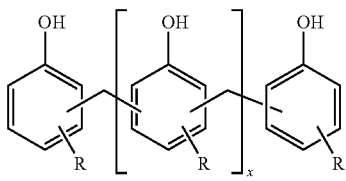

Formula 4

The base-soluble polyglutarimide resins described by Formula 5a are another class of film forming resins (A) that may be used to prepare negative tone compositions of the invention. The polyglutarimide resins may be prepared from acrylic or methacrylic polyesters using a reactive extrusion process wherein the polyester is reacted with anhydrous ammonio or an amine under conditions of elevated temperature and pressure in an extruder apparatus as described in U.S. Pat. No. 4,246,374 incorporated herein by reference. In Formula 5a, the groups $R_1$, $R_2$, and $R_3$ are independently hydrogen or C1 to C20 unsubstituted or substituted alkyl, aryl, alkaryl, or arylalkyl and wherein groups $R_1$ and $R_2$ are derived from the polyester and group $R_3$ is derived from ammonia or an amine,

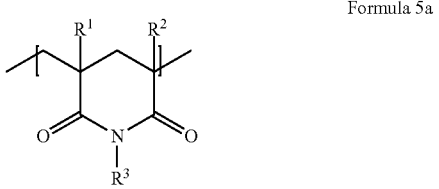

Formula 5a

In cases of 100% reaction, the glutarimide structure is essentially the only repeating unit, but in the case of lower degrees of reaction, in addition to the glutarimide units, acrylic or methacrylic units of Formula 5b, wherein $R_4$ is a lower alkyl or other radical derived from the ester moiety of the acrylic or methacrylic repeat unit of the polyester, will be present.

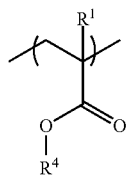

Formula 5b

A specific example of the polyglutarimide resins useful in the invention are the polydimethylglutarimide (PMGI) resins obtained by the reaction of poly[methyl methacrylate] with anhydrous ammonia to yield a resin product according to Formula 5a wherein $R_1$ and $R_2$ are methyl, $R_3$ is hydrogen or methyl and $R_4$ in Formula 5b is hydrogen or methyl.

Yet another class of alkali soluble film forming resins (A) are phenolic derivatives of C36 dimerdiols represented generically by Formula 6a. The groups $R_1$ and $R_2$ are each an alkyl group and the total number of carbon atoms in $R_1$ and $R_2$ and p and q is 30. The group $R_3$ is any moiety containing phenolic hydroxyl groups. A specific example of a dimerdiol phenolic derivative is EC-1074 (Formula 6b) available from Designer Molecules Inc.

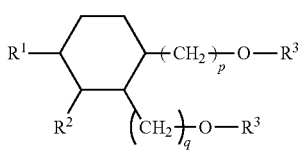

Formula 6a

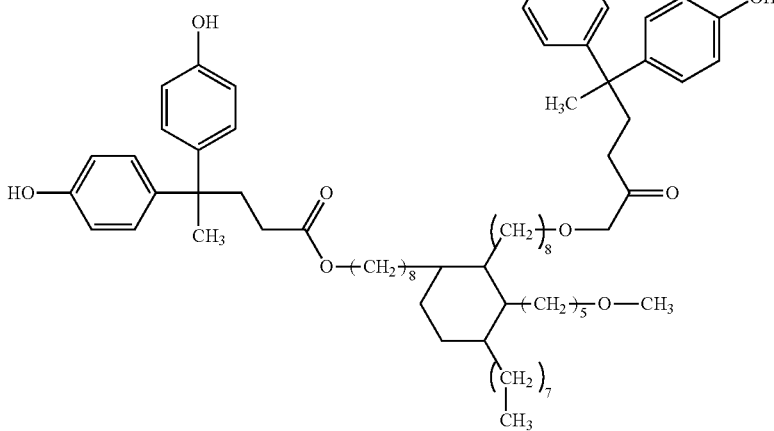

Formula 6b

Alkali insoluble film forming resins (B) suitable for use in the positive tone compositions of the invention all share the common feature of containing an acid labile functional group. The acid produced during the photolysis of the cationic photoinitiator (C) or PAG catalyzes a reaction that removes the acid labile group yielding an alkali soluble functional group which results in the exposed polymer film becoming soluble in aqueous alkali solution. Examples of alkali insoluble resins (B) include, but are not limited to, poly(hydroxystyrene) derivatives according to Formulas 7a and 7b, derivatized copolymers of hydroxystyrene and acrylic monomers corresponding to Formula 8, derivatized copolymers and terpolymers of hydroxystyrene, styrene, and acrylic monomers corresponding to Formula 9, and derivatized copolymers and terpolymers of acrylic monomers according to Formula 10.

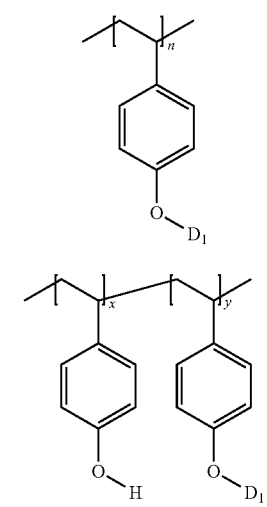

Formula 7a

Formula 7b

The group $D_1$ in Formula 7 is an acid labile group $R_1$ or a moiety B—O—$R_2$ containing an acid labile group $R_2$. Examples of suitable $R_1$ groups include, but are not limited to, the following groups:

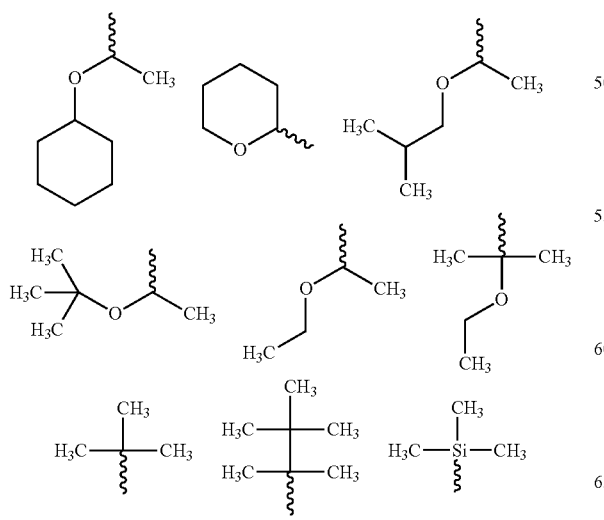

-continued

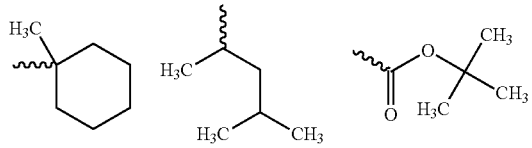

wherein $R_1$ in combination with the oxygen atom attached to the polymer aromatic rings forms groups such as acetal groups, ketal groups, ether groups, and silyl ethers groups. Mixtures of $R_1$ groups may be employed. The —$OR_1$ group may also be a carbonate group. In B—O—$R_2$, B is any suitable divalent group which is not acid labile and $R_2$ is any acid labile group. Those skilled in the art will understand that after removal of $R_2$, the resultant B—OH moiety should be alkali solubilizing in aqueous base. Specific examples of B-O-$R_2$ include but are not limited to, the following structures:

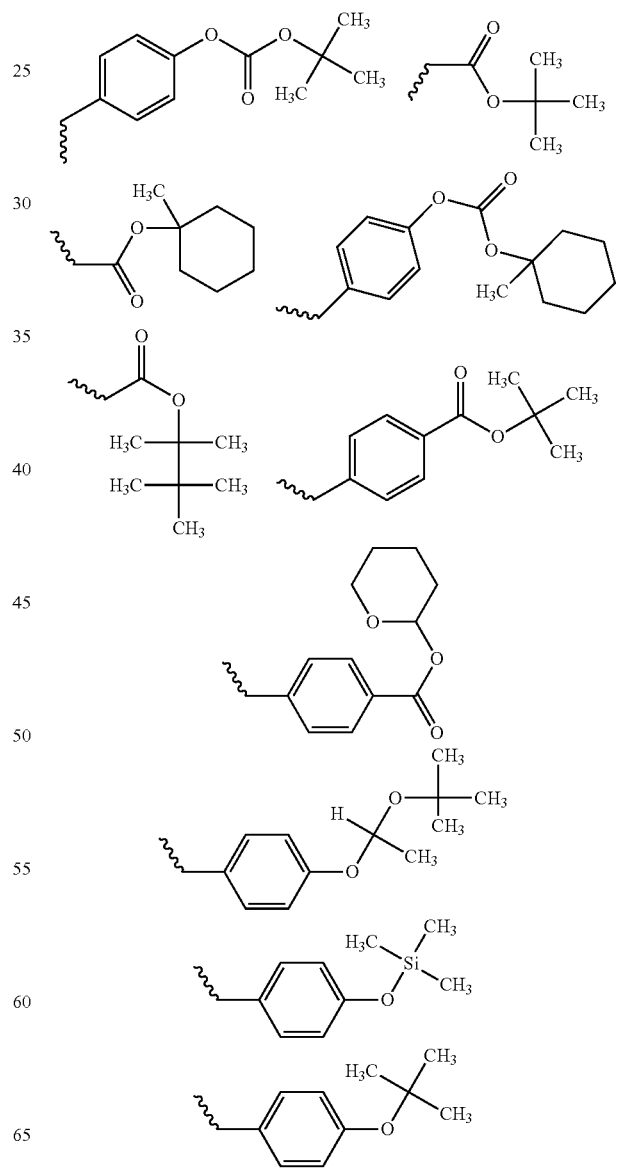

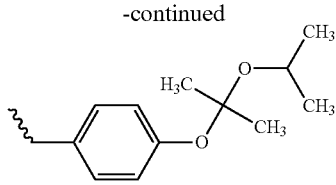

As a specific example of alkali soluble polymers according to Formula 6a, U.S. Pat. No. 4,491,628, hereby incorporated by reference, describes positive tone compositions comprising poly(tert-butoxycarbonyloxy)styrene polymers.

In the derivatized copolymers of hydroxystyrene and acrylic monomers corresponding to Formula 8, the group $R_1$ may be hydrogen or an acid labile group and the group $R_2$ is a group such a tert-butyl that forms an acid labile ester group attached to the acrylate monomer units, or a $C_1$ to $C_{14}$ alkyl, aryl, or aralkyl group. Specific examples of polymers according to Formula 8 are described in U.S. Pat. No. 5,492,793 hereby incorporated by reference.

Formula 8

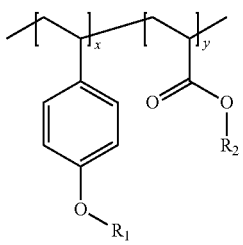

Terpolymers of hydroxystyrene, styrene and alkyl substituted styrene, and acid labile acrylate ester monomers as described by Formula 9 are also suitable as non-alkali soluble resin (B).

Formula 9

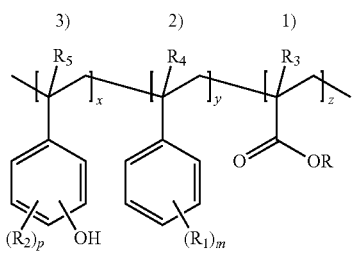

The polymer resins according to Formula 9 have three types of repeating units, designated as units 1-3, in which repeating units 1) contain an acid labile moiety, repeating units 2) that are free of reactive groups and hydroxyl groups, and repeating unit 3 that contain aromatic and other groups that contribute to resin aqueous solubility. In Formula 9, the R groups of units 1) is a substituted or unsubstituted alkyl preferably having 1 to about 10 carbon atoms, more typically 1 to about 6 carbons. Branched alkyls such as tert-butyl are generally preferred R groups. Also, the polymer may comprise a mixture of different R groups, e.g., by using a variety of acrylate monomers during the polymer synthesis.

The $R_1$ groups of units 2) of Formula 9 each independently may be e.g. halogen (particularly F, Cl and Br), $C_1$ to $C_8$ substituted or unsubstituted alkyl, $C_1$ to $C_8$ substituted or unsubstituted alkoxy, $C_2$ to $C_8$ substituted or unsubstituted alkenyl, $C_2$ to $C_8$ substituted or unsubstituted alkynyl, $C_1$ to $C_8$ substituted or unsubstituted alkylthio, cyano, nitro, etc. The letter m is an integer of from 0 (where the phenyl ring is fully hydrogen-substituted) to 5, and preferably is 0, 1 or 2. Also, two $R_1$ groups on adjacent carbons may be taken together to form (with ring carbons to which they are attached) one, two or more fused aromatic or alicyclic rings having from 4 to about 8 ring members per ring. For example, two $R_1$ groups can be taken together to form (together with the depicted phenyl) a naphthyl or acenaphthyl ring. As with units 1), the polymer resin may comprise a mixture of different units 2) with differing $R_1$ groups or no $R_1$ groups (i.e. m=0) by using a variety of substituted or unsubstituted vinylphenyl monomers during the polymer synthesis.

The $R_2$ groups of units 3) of Formula 9 each independently may be e.g. halogen (particularly F, Cl and Br), $C_1$ to $C_8$ substituted or unsubstituted alkyl, $C_1$ to $C_8$ substituted or unsubstituted alkoxy, $C_2$ to $C_8$ substituted or unsubstituted alkenyl, $C_1$ to $C_8$ substituted or unsubstituted sulfonyl such as mesyl ($CH_3SO_2O$—), substituted or unsubstituted alkyl esters such as those represented by RCOO— where R is preferably an $C_1$ to $C_{10}$ alkyl group, $C_2$ to $C_8$ substituted or unsubstituted alkynyl, $C_2$ to $C_8$ substituted or unsubstituted alkylthio, cyano, nitro, etc. The letter p is an integer of from 0 (where the phenyl ring has a single hydroxy substituent) to 4, and preferably is 0, 1 or 2. Also, two $R_2$ groups on adjacent carbons may be taken together to form (with ring carbons to which they are attached) one, two or more fused aromatic or alicyclic rings having from 4 to about 8 ring members per ring. For example, two $R_2$ groups can be taken together to form (together with the phenol depicted in Formula 9) a naphthyl or acenaphthyl ring. As with units 1), the polymer may comprise a mixture of different units 3) with differing $R_2$ groups or no $R_2$ groups (i.e. p=0) by using a variety of substituted or unsubstituted vinylphenyl monomers during the polymer synthesis. As shown in Formula 8 above, the hydroxyl group of units 3) may be either at the ortho, meta or para positions throughout the copolymer. Para or meta substitution is generally preferred. Each $R_3$, $R_4$ and $R_5$ substituent independently may be hydrogen or substituted or unsubstituted alkyl preferably having 1 to about 8 carbon atoms, more typically 1 to about 6 carbons, or more preferably 1 to about 3 carbons. The above-mentioned substituted groups (i.e. substituted groups R and $R_1$ through $R_5$) may be substituted at one or more available positions by one or more suitable groups such as halogen (particularly F, Cl or Br); $C_1$ to $C_8$ alkyl; $C_1$ to $C_8$ alkoxy; $C_2$ to $C_8$ alkenyl; $C_2$ to $C_8$ alkynyl; aryl such as phenyl; $C_1$ to $C_6$ alkanoyl such as a $C_1$ to $C_6$ alkanoyl of acyl and the like; etc. Typically a substituted moiety is substituted at one, two or three available positions. In the above Formula 8, x, y and z are the mole fractions or percentages of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.

Specific examples of polymeric resins according to Formula 9 are described in U.S. Pat. No. 6,042,997 hereby incorporated by reference.

The polymeric resins described in Formulas 7a, 7b, 8, and 9 are especially useful as resin component (B) in positive tone, photoimageable compositions for application at imaging wavelengths in the 220-450 nm range when combined with cationic photoinitiators (C) and photosensitizers (J) selected for good radiation absorbance in the 220-450 nm range.

Polymeric resins containing alkyl and alicyclic repeating units are another group of alkali insoluble resins (B) that may be used and are particularly useful in applications requiring exposure to active rays of a wavelength less than 220 nm such as wavelengths of 193 nm and 157 nm. Resins (B) containing aromatic groups are not appropriate for use at wavelength less than 220 nm because of their high absorbance at wavelengths less than 220 nm. A large variety of such resin structures have been described and specific examples are shown in FIGS. 10a and 10b. The group $R_1$ in Formula 10b is fluoro, methyl, or trifluoromethyl and the group R2 is selected so as to render $R_2$ acid cleavable. Additional examples of alkali insoluble polymer resins (B) suitable for use in short wavelength exposures are described in U.S. Pat. Nos. 6,602,646, 6,730,452, 7,358,027, and 7,479,364.

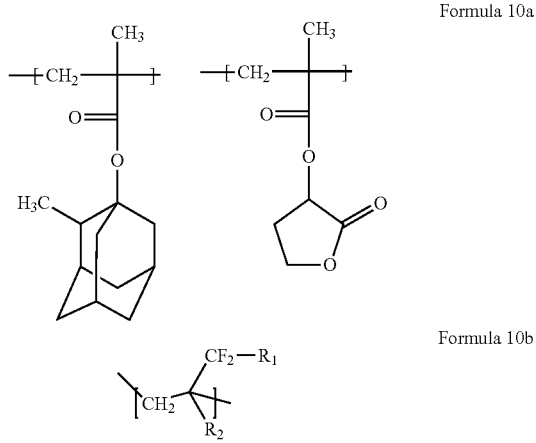

Formula 10a

Formula 10b

Compounds that generate an acidic species when irradiated by active rays, such as ultraviolet radiation, X-rays, light, and the like, are preferred as the cationic photoinitiator (C) used in the present invention. The cationic photoinitiator compounds (C) are also referred to in the formulation art as photoacid generators or PAG(s). Aromatic iodonium complex salts and aromatic sulfonium complex salts are cited as examples. Di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, and the like are cited as specific examples of the aromatic iodonium complex salts that can be used. Moreover, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenylsulfide bis-hexafluorophosphate, 4,4'-bis[di(β-hydroxyethoxy)phenylsulfonium]diphenylsulfide bis-hexafluoroantimonate, 4,4'-bis[di(β-hydroxyethoxy)(phenylsulfonium)diphenyl sulfide-bis-hexafluorophosphate 7-[di(p-tolyl)sulfonium]-2-isopropylthioxanthone hexafluorophosphate, 7-[di(p-tolyl)sulfonium]-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenylsulfide tetrakis(pentafluorophenyl)borate, diphenyl[4-(phenylthio)phenyl]sulfonium hexafluoroantimonate and the like can be cited as specific examples of the aromatic sulfonium complex salts that can be used. CYRACURE 6979 (mixed aromatic sulfonium hexafluoroantimonate salts) available from Dow is an example of a useful photoacid generator. Irgacure PAG 290 and GSID26-1 available from BASF are examples of useful photoacid generator compounds that do not contain antimony. Other suitable photocationic initiators include sulfonated esters and sulfonyloxy ketones may also be used. See *J. Photopolymer Science and Technology*, 4(3):337-340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonated cationic photoinitiators are also disclosed in U.S. Pat. No. 5,344,742 hereby incorporated by reference.

Other useful acid generators include nitrobenzyl esters and s-triazine derivatives. Suitable s-triazine acid generators are disclosed, for example, in U.S. Pat. No. 4,189,323. Halogenated non-ionic, photoacid generating compounds also may be suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl)benzhydrol (Kelthane): hexachlorodimethyl sulfone; 2-chloro-6-(trichloromethyl)pyridine; o,o-diethyl-o-(3,5,6-trichloro-2-pyridyl)phosphorothionate; 1,2,3,4,5,6-hexachlorocyclohexane; N-(1,1-bis[p-chlorophenyl]-2,2,2-trichloroethyl) acetamide, tris[2,3-dibromopropyl]isocyanurate; 2,2-bis[p-chlorophenyl]1,1-dichloroethylene; tris[trichloromethyl]-s-triazine; and their isomers, analogs, homo logs, and residual compounds. Suitable photoacid generators are also disclosed in European Patent Application Nos. 0164248 and 0232972 hereby incorporated by reference.

The cationic photoinitiators (C) can be used alone or as mixtures of two or more compounds.

The radical photoinitiator (D) may be those known to persons skilled in the art that have sufficiently high sensitivity in the wavelength range in which the resist composition is required to be photosensitive. Examples of such photoinitiators are, e.g., indicated by K. K. Dietliker in "Chemistry and Technology of UV and EB formulation for Coatings, Inks and Paints", Volume 3: "Photoinitiators for Free Radical and Cationic Polymerization". For example, benzoin ethers are suitable and benzoin methyl ether is a specific example. Ketals, such as diethoxyacetophenone or benzildimethyl ketal, are also suitable photoinitiators as are hexaarylbisimidazole and quinones, such as 2-tertbutylanthraquinone. Thioxanthone compounds of which thioxanthone, 2-isopropylthioxanthone or 2-chlorothioxanthone are examples, may be used as well as azides and acylphosphine oxides such as 2,4,6-trimethylbenzoyldiphenyl phosphine oxide.

Other examples of suitable radical photoinitiators (D) are oxime esters, particularly as described in U.S. Pat. No. 5,019,482, hereby incorporated by reference, as well as photoinitiator systems containing ketocoumarin derivatives, as well as amines as activators, such as is described in U.S. Pat. No. 4,366,228, whose description is hereby incorporated by reference.

Another class of radical photoinitiators (D) that may be used are the organotitanocenes as described in U.S. Pat. No. 4,548,891 hereby incorporated by reference. Specific examples of suitable organotitanocenes are described by Formulas 11 to 14:

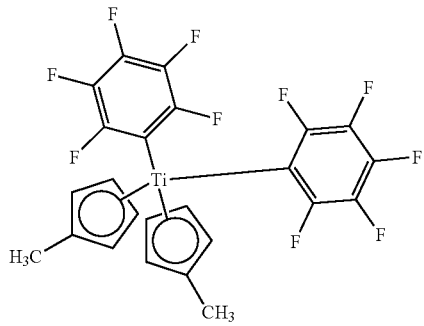

Formula 11

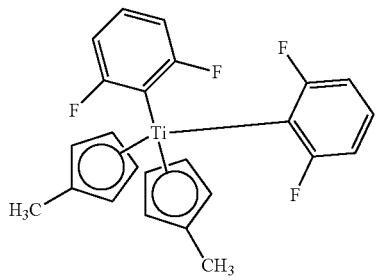

Formula 12

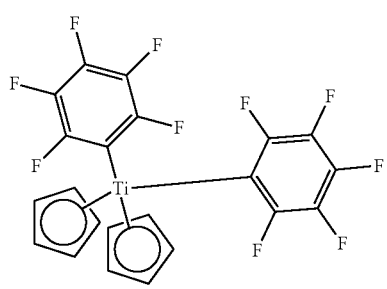

Formula 13

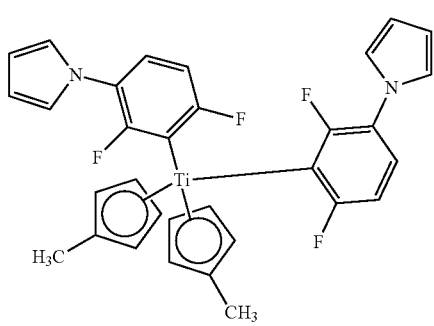

Formula 14

Other preferred radical photoinitiators (D), which may be used in the invention, are the oxime esters described in U.S. Pat. No. 5,019,482 hereby incorporated by reference. Particularly preferred are the triketoxime esters according to Formula 15:

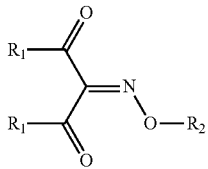

Formula 15 in which the residues $R_1$, independently of one another, stand for p-tolyl, p-alkoxyphenyl or mesityl, and $R_2$ indicates $C_1$-$C_6$ alkylcarbonyl, $C_1$-$C_6$ alkoxycarbonyl, $C_6$-$C_{14}$ arylcarbonyl or $C_6$-$C_{14}$ aryloxycarbonyl. The triketone oxime esters of formula (VIII) may be prepared according to known methods for the conversion of the corresponding triketones into oximes (e.g., according to "Organic Synthesis, Vol. 40, Pages 21-23) and subsequent reaction of the oximes with acid chlorides or chlorocarbonyl acid esters. The preferred compounds of Formula 15, $R_1$ is a p-tolyl group and $R_2$ stands for a $C_6$-$C_{14}$ arylcarbonyl group. A specific example of a preferred oxime ester compound is described by Formula 15a.

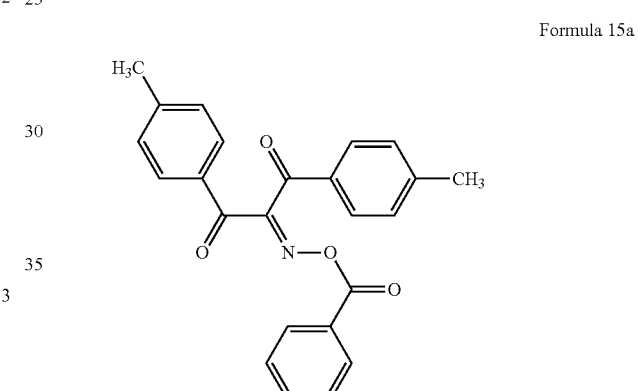

Formula 15a

Appropriately, the compositions according to the invention contain 0.1 to 20 wt. %, particularly 1 to 10 wt. % of component (D), with respect to component (A).

The triketoxime esters of Formula 15 are utilized preferably in combination with an aromatic amine of Formula 16:

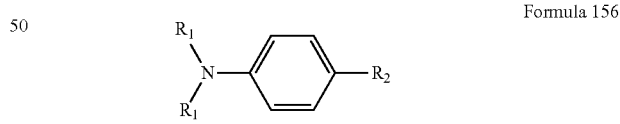

Formula 156 in which the two $R_1$ residues, independently of one another, stand for $C_1$-$C_3$ alkyl or $C_1$-$C_3$ hydroxyalkyl or form a morpholine group together with the N atom, and $R_2$ represents a $C_1$-$C_3$ alkyl group, $C_2$-$C_5$ alkylcarbonyl group, or $C_7$-$C_{10}$ arylcarbonyl group. Examples of suitable aromatic amines of Formula 15 include, but are not limited to, 4-dimethylaminoacetophenone, 4-morpholino acetophenone, 4-dimethylaminobenzophenone, 4-morpholinobenzophenone, N-phenyldiethanolamine, N-p-tolyldiethylamine and N-p-tolyldiethanolamine. The aromatic amines of Formula 15 are added in an amount of 0.5-5 wt. %, with respect to component (A).

The radical photoinitiators (D) can be used alone or as mixtures of two or more compounds. Moreover and in instances wherein alkali soluble resin (A) contains reactive carbon-carbon double bonds and wherein cross linking compound or resin (G) contains cationically reactive groups, mixtures of one or more cationic photoinitiators (C) with one or more radical photoinitiators (D) with the proviso that the radical photoinitiators (D) used in such a mixture is not a proton acceptor (base).

A film casting solvent (E) is used in the present invention and any solvent can be used as long as it is an organic solvent capable of dissolving the other components in the composition and it use does not cause coating defects such a bubbles, dewetted areas, and rough coating surfaces when the compositions are coated and dried on a substrate.

Examples of ketone solvents that can be used include acetone, 2-butanone, 2-pentanone, 3-pentanone, methyl isobutyl ketone, methyl t-butyl ketone, cyclopentanone, cyclohexanone, and the like. Examples of ether solvents that can be used include dipropylene glycol dimethyl ether, tetrahydrofuran, tetrahydrofurfuryl alcohol 1,3-dioxolane, 1,4-dioxane, dimethoxyethane, and diglyme. Examples of ester solvents that can be used include ethyl acetate, butyl acetate, ethylene glycol monobutyl ether acetate, diethylene glycol monomethyl ether acetate, propylene glycol monomethyl ether acetate, gamma-butyrolactone, and the like. Dimethyl carbonate, diethyl carbonate, and propylene carbonate are examples of carbonate solvents that can be used. Examples of aromatic and aliphatic hydrocarbon solvents that can be used in minor amounts in a solvent mixture containing a major amount of one or more solvents selected from the group comprising ketone, ester, or ether solvents include toluene, xylene, 1,2,4,5-tetramethylbenzene, octane, decane, petroleum distillates, and the like. When used in combination with ketone, ester, or ether solvents, these hydrocarbon solvents can be used alone or as a mixture of two or more hydrocarbon solvents.

Solvents and solvent mixtures are selected according to the engineering demands of a particular application and the available process equipment such that the desired composition viscosity and drying characteristics are obtained.

A fluorinated compound (F) is used in the present invention. Fluorinated compounds suitable for use are generally organic compounds in which either all or a majority of the carbon valences not comprising carbon to carbon bonds are carbon to fluorine bonds. The fluorinated compounds are generally liquids with surface tensions less than 20 dyn/cm that may be further characterized by means of their Hansen solubility parameters wherein the dispersion solubility parameter ($\delta_D$) of the fluorinated compounds ranges from 8 to about 15, the polar solubility parameter ($\delta_P$) of the fluorinated compound ranges from 0 to about 2, and the hydrogen bonding solubility parameter ($\delta_D$) of the fluorinated compound ranges from 0 to about 2. Suitable fluorinated compounds include, but are not limited to, perfluorohexane, perfluorooctane, perfluorodecalin, 2,3-dihydrofluoropentane, hexafluorobenzene, HFC 338pcc, HFC-365mfc, perfluorodimethylcyclohexane, perfluoroheptane, perfluoromethylcyclohexane, perfluoropentane, HFE-7200 (1-ethoxy-1,1,2,2,3,3,4,4,4-nonafluorobutane), HFE-7300 (1,1,1,2,2,3,4,5,5,5-decafluoro-3-methoxy-4-trifluoromethyl-pentane), HFE-7500 (3-ethoxy-1,1,1,2,3,4,4,5,5,6,6,6-dodecafluoro-2-(trifluoromethyl)-hexane), furan, 2,2,3,4,4,5-hexafluorotetrahydro-3-(pentafluoroethyl)-5-(trifluoromethyl)-cis-, furan, 2,2,3,4,4,5-hexafluorotetrahydro-3-(pentafluoroethyl)-5-(trifluoromethyl)-, trans-, furan, 2,2,3,4,4,5-hexafluorotetrahydro-5-(pentafluoroethyl)-3-(trifluoromethyl)-, trans-, furan, 2,2,3,4,4,5-hexafluorotetrahydro-5-(pentafluoroethyl)-3-(trifluoromethyl)-, cis-, furan, 2,3,3,4,4,5-hexafluorotetrahydro-2-(pentafluoroethyl)-5-(trifluoromethyl)-, 2h-cyclopenta[b]furan, 2,2,3,3a,4,4,5,5,6,6,6a-undecafluorohexahydro-3-(trifluoromethyl)-, furan, 2,2,3,4,4,5-hexafluorotetrahydro-3,5-bis(pentafluoroethyl)-, furan, 2,2,3,4,4,5-hexafluoro-3-(heptafluoropropyl)tetrahydro-5-(trifluoromethyl)-, furan, 2,2,3,4,4,5-hexafluoro-5-(heptafluoropropyl)tetrahydro-3-(trifluoromethyl)-, trans-, furan, 2,2,3,4,4,5-hexafluoro-5-(heptafluoropropyl)tetrahydro-3-(trifluoromethyl)-, cis-, furan, 2,3,3,4,4,5-hexafluoro-2-(heptafluoropropyl)tetrahydro-5-(trifluoromethyl)-, 1,1,1,2,2,3,3,4,4-nonafluorohexane, perfluoromethylcyclopentane, dodecafluorodimethylcyclobutane, 1h,1h,2h-perfluoro-1-decene, perfluoro-1,3-dimethylcyclohexane, 1h-perfluoroheptane, perfluoroheptene-1,6h-perfluorohexane, perfluoromethyldecalin, perfluorooctene-1,1h,1h,2h-perfluoro-1-octene, perfluorononane, perfluorodecane, 1,1,1,2,2,3,3,4,4,5,5,6,6-tridecafluoro-6-methoxy-hexane, 2-difluoromethylperfluorooxolane, and fluorinated liquids such as FC-40, FC-43, FC-72, FC-77, and FC-84 manufactured by the 3M Company The fluorinated compounds according to the invention may be used in mixtures of two or more compounds.

A crosslinking compound or resin (G) is used in certain embodiments to provide a negative tone relief image. Cross linking compounds that contain glycidyl, oxetane, and —N—(CH$_2$—OR)$_n$ units wherein n=1 or 2 groups, are preferred cross linking compounds for use in compositions that comprise an alkali soluble resin (A) and a cationic photoinitiator (C).

Cross linking compounds (G) that may be used with cationic photoinitiators (C) include glycidyl ethers containing two or more glycidyl ether groups such as diethylene glycol diglycidyl ether, propylene glycol diglycidyl ether, polypropylene glycol diglycidyl ether, hexanediol diglycidyl ether, trimethylolpropane triglycidyl ether, pentaerythritol tetraglycidyl ether, and the like. The glycidyl ethers can be used alone or as mixtures of two or more. Trimethylolpropane triglycidyl ether and propylene glycol diglycidyl ether are preferred examples of reactive monomers (H) that can be used in the invention. Epoxy compounds such as 3,4-epoxycyclohexylmethyl methacrylate and 3,4-epoxycyclohexylmethyl-3',4'-epoxycyclohexane carboxylate may also be used as cross linking compound in combination with cationic photoinitiator (C).

Examples of epoxy resins that may be used as cross linking compound (G) are multifunctional glycidates of bisphenol A formaldehyde resin and multifunctional glycidates of polyphenolic compounds such as bisphenol A, bisphenol F, bisphenol S, thiodiphenol, fluorene bisphenol, terpene diphenol, 4,4'-biphenol, 2,2'-biphenol, 3,3',5,5'-tetramethyl-[1,1'-biphenyl]-4,4'-diol, hydroquinone, resorcinol, naphthalenediol, tris-(4-hydroxyphenyl)methane, and 1,1,2,2,-tetrakis(4-hydroxyphenyl)ethane, Particularly preferred epoxy resins that may be used as cross linking compound E are described by Formula 1 and Formula 2. Specific examples of commercial multifunctional glycidates suitable for use as cross linking compound (G) are Techmore VG3101 (Printec Co.) and NC-6300H (Nippon Kayaku Co., Ltd.). SU-8 resin is an example of a commercial bisphenol A formaldehyde resin that is suitable for use as cross linking compound (G). Epoxy resins that are linear polycondensates of bisphenols with epichlorohydrin may also be used as a cross linking compound (G) and a specific example is EX 2177 available from Epoxonic GmbH.

Aliphatic and aromatic difunctional and/or polyfunctional oxetane compounds are another group of cross linking compounds (G) that can be used in combination with cationic photoinitiators (C) in the present invention. Specific examples of the aliphatic or aromatic oxetane reactive monomers that can be used include xylylene dioxetane, bis(3-ethyl-3-oxetanylmethyl)ether, and the like. These difunctional and/or polyfunctional oxetane compounds can be used alone or as mixtures of two or more.

Additional crosslinking compounds (G) containing —N—(CH$_2$—OR)$_n$ units wherein n=1 or 2 that can be used in combination with cationic photoinitiators (C) can include, for example, single compounds, oligomers, polymers, or mixtures thereof each containing at least two —N(CH$_2$OR)$_n$ groups. Such crosslinking agents may be prepared by the reaction of a variety of polyamino compounds with formaldehyde in the presence of alcohols such as methanol, ethanol, or butanol or in other solvents followed by an etherification step. Examples of suitable polyamino compounds include urea, melamine, benzoguanamine, glycouril, or diguanamines, as described in U.S. Pat. No. 5,545,702, and guanidine Examples of suitable classes of such crosslinking compounds (G) containing —N(CH$_2$OR) groups include but are not limited to the alkoxymethylmelamines, the alkoxyamethylglycolurils, the alkoxymethylbenzoguanamines, the alkoxymethyldiguanamines derived from diguanamines as described in U.S. Pat. No. 5,545,702, and melamine or benzoguanamine polymers as described in U.S. Pat. No. 6,524,708. Specific examples of compounds having multiple —N—(CH2-0R)n units include but are not limited to:

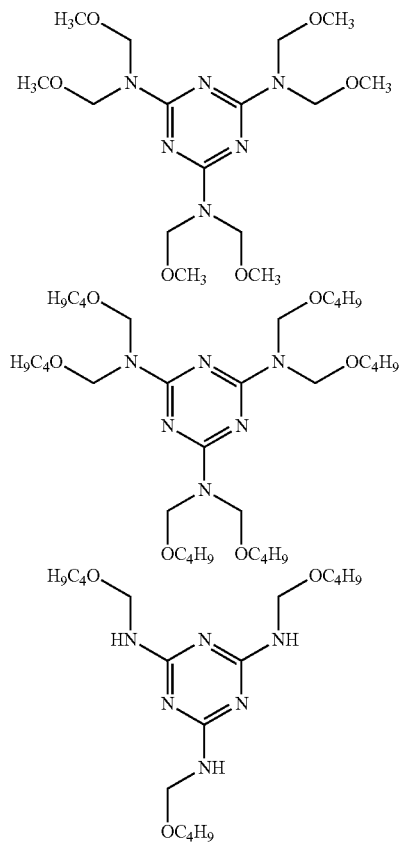

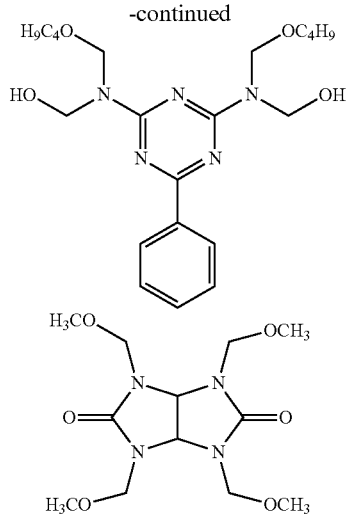

Materials having —N—(CH$_2$—OR)$_n$ units are available commercially from Cytec Industries and Solutia as the Cymel, Powderlink, and Resimene series of products.

Compounds that contain a reactive carbon-carbon double bond in their structures may be used as cross linking compounds (G) when radical photoinitiators (D) are used in combination with aqueous alkali soluble resin (A) that also contain a reactive carbon-carbon double bond in their structure. Representative examples of such cross linking compounds (G) include 1,6-hexandiol diacrylate, neopentyl glycol diacrylate, ethylene glycol diacrylate, polyethylene glycol diacrylates having 2 to 20 of repeating units, pentaerythritol diacrylate, dipentaerythritol hexacrylate, trimethylolpropane triacrylate, tetramethylolmethane tetraacrylate, methylene bisacrylamide, N-methylolacrylamide, and the corresponding methacrylate and methacrylamide congeners to the above-mentioned compounds. The crosslinking compounds (G) containing reactive carbon-carbon bonds may be used in mixtures of one or more compounds.

Optionally, it may be beneficial in certain embodiments to include a surfactant compound (H) in the composition to improve coating uniformity and surface finish.

Examples of suitable surfactants include fluorinated poly (oxetane) polymers from Omnova Solutions and specific examples include PF-6320, PF-6520, and PF 7002. Other suitable materials are the Capstone® fluorosurfactants FS-22, FS-65, and FS-83 and Zonyl® fluorosurfactants FSA, FSJ, FSN, FSO, and FSP made by the Dupont Company and Disparlon® 1970 and 230 acrylic surface leveling agents manufactured by Kusumoto Chemicals, Ltd., Tokyo, Japan.

Optionally, it may be beneficial in certain embodiments to use optional epoxy resins (I) in the composition. Depending on its chemical structure, optional epoxy resin (I) may be used to adjust the lithographic contrast of the photoresist or to modify the optical absorbance of the photoresist film. The optional epoxy resin (I) may have an epoxide equivalent weight ranging from 160 to 800 grams resin per equivalent of epoxide. An example of an optional resins suitable for use include EOCN 4400, an epoxy cresol-novolac resin with an epoxide equivalent weight of about 195 g/eq manufactured by Nippon Kayaku Co., Ltd., Tokyo, Japan Optionally, it may be useful to include photosensitizer compounds (J) in the composition so that more ultraviolet rays are absorbed and the energy that has been absorbed is transferred to the cationic photopolymerization initiator. Consequently, the photosensitivity of the composition is improved and the process time for exposure is decreased. Moreover, inclusion of optional photosensitizers (J) in the compositions can broaden the range of ultraviolet wavelengths in which the composition may by imaged.

For example, the triketoximes and triketoxime/amine mixtures described above are particularly suitable for exposure with radiation having a wavelength of 365 nm (the mercury lamp i-line). By the inclusion of additional photosensitizers, one can also provide photosensitivity in other spectral regions, for example, at a wavelength of 436 nm (the mercury lamp g-line).

Photosensitizer compounds (J) that are particularly preferred in combination with cation photoinitiators (C) include derivative of anthracene, N-alkyl carbazole, and halo-fluorone compounds, Anthracene compounds with alkoxy groups at positions 9 and 10 (9,10-dialkoxyanthracenes) are preferred photosensitizers (I). $C_1$ to $C_4$ alkoxy groups such as methoxy, ethoxy, propoxy, and butoxy groups are cited as the preferred alkoxy groups. The 9,10-dialkoxyanthracenes can also have substituent groups. Halogen atoms such as fluorine atoms, chlorine atoms, bromine atoms, and iodine atoms, $C_1$ to $C_4$ alkyl groups such as methyl groups, ethyl groups, and propyl groups, sulfonic acid groups, sulfonate ester groups, carboxylic acid alkyl ester groups, and the like are cited as examples of substituent groups. C1 to C4 alkyls, such as methyl, ethyl, and propyl, are given as examples of the alkyl moiety in the sulfonic acid alkyl ester groups and carboxylic acid alkyl ester groups. The substitution position of these substituent groups is preferably at position 2 of the anthracene ring system. 9,10-Dimethoxyanthracene, 9,10-diethoxyanthracene, 9,10-dipropoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulonic acid, 9,10-dimethoxyanthracene-2-sulfonic acid methyl ester, 9,10-diethoxyanthracene-2-sulfonic acid methyl ester, 9,10-dimethoxyanthracene 2-carboxylic acid, 9,10-dimethoxyanthracene-2-carboxylic acid methyl ester, and the like can be cited as specific examples of the 9,10-dialkoxyanthracenes that can be used in the present invention. Examples of N-alkyl carbazole compounds useful in the invention include N-ethyl carbazole, N-ethyl-3-formyl-carbazole, 1,4,5,8,9-pentamethyl-carbazole, N-ethyl-3,6-dibenzoyl-9-ethylcarbazole and 9,9'-diethyl-3,3'-bicarbazole. Examples of halo-fluorone photosensitizers include 5,7-diiodo-3-butoxy-6-fluorone, 3-hydroxy-2,4,5,7-tetraiodo-6-fluorone, and 9-cyano-3-hydroxy-2,3,5,7-tetraiodo-6-fluorone and additional fluorone compounds are disclosed in U.S. Pat. Nos. 5,395,862 and 5,451,343, incorporated herein by reference. The sensitizer compounds (J) can be used alone or in mixtures of two or more.

Coumarin derivatives are photosensitizer compounds (J) particularly useful in combination with radical photoinitiators (D). For example, one can add a coumarin compound according to Formula 17

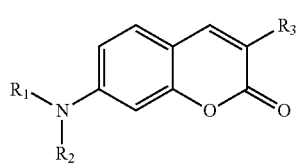

Formula 17 in which $R_1$ and $R_2$, independently of one another, are $C_1$-$C_6$ alkyl groups and $R_3$ indicates $C_1$-$C_6$ alkylcarbonyl, $C_1$-$C_6$-alkoxycarbonyl, $C_6$-$C_{14}$-arylcarbonyl or $C_6$-$C_{14}$-aryloxycarbonyl groups.

Preferably, the coumarins disclosed in U.S. Pat. No. 5,019,482 may be utilized and the coumarin described by Formula 17a is particularly preferred.

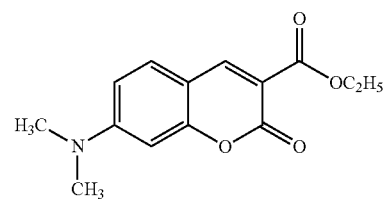

Formula 17a

The coumarins of Formula 16 are generally utilized in an amount of 0.1-5 wt. % with respect to component (A). Another particularly preferred coumarin has the Formula 17:

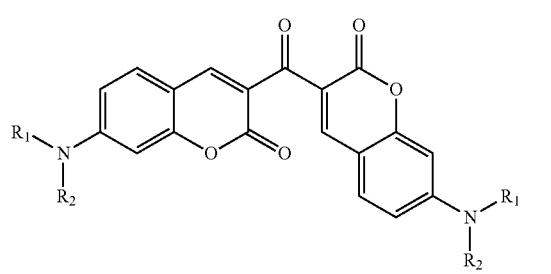

Formula 18 in which $R_1$ and $R_2$ stand for a methyl or an ethyl group. This coumarin derivative is also appropriately utilized in a quantity of 0.1 to 5 wt. %, with respect to alkali soluble resin component (A).

The photosensitivity of the compositions containing radical photoinitiators (D) according to the invention can also be increased by the addition of aromatic heterocyclic compounds containing at least one mercapto group. Examples of such compounds are 2-mercaptobenzimidazole, 2-mercaptobenzothiazole, 1-pheny 1-5-mercapto-1H-tetrazole, 2-mercapto-4-phenylthiazole, 2-amino-5-mercapto-4-phenylthiazole, 2-amino-4-mercapta-1,3,4-thiazole, 2-mercaptoimidazole, 2-mercapto-5-methyl-1,3,4-thiazole, 5-mercapto-1-methyl-1H-tetrazole, 2,4,6-trimercapto-s-triazine, 2-dibutylamino-4,6-dimercapto-s-triazine, 2,5-dimercapto-1,3,4-thiadiazole,5-mercapto-1,3,4-thiadiazole, 1-ethyl-5-mercapto-1,2,3,4-tetrazole, 2-mercapto-6-nitrothiazole, 2-mercapto-benzoxazole, 4-phenyl-1-2-mercaptothiazole, mercaptopyridine, 2-mercaptoquinoline, 1-methyl-2-mercaptoimidazole and 2-mercapto-(naphthothiazole). Such mercapto compounds are generally utilized in a quantity of 0.5-5 wt. % relative to alkali soluble resin component (A). Preferably, 2-mercaptobenzothiazole is used.

Another special form of embodiment of the invention contains a coumarin of Formula 19 as the photoinitiator system:

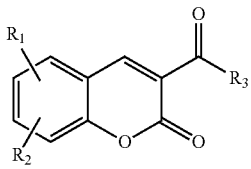

Formula 19 in which $R_1$ and $R_2$, independently of one another, indicate hydrogen or $C_1$-$C_6$ alkoxy and $R_3$ stands for $C_6$-$C_{14}$ aryl or a residue of Formula 20:

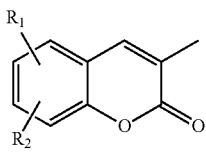

Formula 20 in which $R_1$ and $R_2$ again have the same meaning as in Formula 18, in mixture with an amino acid of Formula 21:

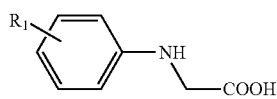

Formula 21 in which $R_1$ stands for hydrogen, methyl, ethyl, i-propyl, t-butyl, phenyl, methoxy, ethoxy, hydroxy, hydroxymethyl, dimethylamino, diethylamino, acetyl, propionyl, acetyloxy, propionyloxy, —NHCONH$_2$ or —NHCOOCH$_3$. The coumarins of Formula 19 are known, for example, from U.S. Pat. No. 4,278,751. Coumarins of Formula 19 are preferred, in which one of the residues $R_1$ or $R_2$ indicates methoxy. Particularly preferred is 3-benzoyl-7-methoxycoumarin. In addition, the amino acids of Formula 21 are known, and described, for example, in JP-A Hei 03 [1991]-170, 551 (Chem. Abstr., Vol. 116 (1992), 31468b). Preferably, N-phenylglycine is used. Corresponding compositions of the invention generally contain 0.2-5 wt. % coumarins of Formula 19, 0.5-10 wt. % amino acid of Formula 21, with respect to component (A). Other suitable sensitizers, which can be used particularly in combination with coumarins of Formula 181, are the oxazolones described in JP-A Hei [1991] 03-170, 552 (Chem. Abstr., Vol. 116 (1992), 48941y), particularly oxazolones according to Formula 22:

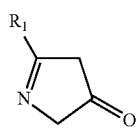

Formula 22 in which $R_1$ stands for a group of Formulas 23 or 24:

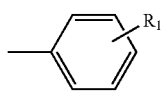

Formula 23

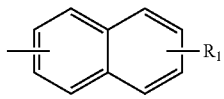

Formula 24 in which $R_1$ indicates hydrogen, methyl, ethyl, n-propyl, i-propyl, n-butyl, t-butyl, phenyl, hydroxy, methoxy, ethoxy, n-propoxy, n-butoxy, phenoxy, benzyl, 2-phenylethyl, hydroxymethyl, 2-hydroxyethyl, acetyl, propionyl, acetyloxy, propionyloxy, aminomethyl, 2-aminoethyl, methylamino, dimethylamino, diethylamino, —CONH$_2$, —CONHCH$_3$, —CON(CH$_3$)$_2$, —CONHC$_2$H$_5$ or —CON(C$_2$H$_5$)$_2$. The preferred oxazolone is 3-phenyl-5-isooxazolone.

Examples of optional adhesion promoting compounds (K) that can be used in the invention include: 3-glycidoxypropyltrimethoxysilane, 3-glycidoxypropyltriethoxysilane, 3-mercaptopropyltrimethoxysilane, vinyltriethyoxysilane, and the like.

Optionally, it may be useful to include light absorbing compounds (L) that absorb actinic rays. Such compounds can be used to provide a relief image cross section that has a reverse tapered shape such that the imaged material at the top of the image is wider than the imaged material at the bottom of the image. Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, azo dyes such as Sudan Orange G, coumarin compounds such as 4-methyl-7-diethylamino-1-benzopyran-2-one, thioxanthone compounds such as diethylthioxanthone, 1-chloro-4-propoxy-thioxanthone, thioxanthone compounds according to U.S. Pat. Nos. 4,585,876 and 4,681,959 hereby incorporated by reference, stilbene compounds, naphthalic acid compounds, and the like are cited as specific examples of the compounds (J) that can be used in the present invention either singly or as mixtures.

In certain embodiments, it may be advantageous to include optional light absorbing components (L) that add opacity to the final structures made from the composition of the invention. In this context, the light absorbing compound (L) functions as a dye. Light absorbing components (L) used for this purpose are ionic and have the general structure C$^+$D$^-$, where C$^+$ is the cationic species and D$^-$ is the anionic species. Suitable cationic species for the dye include cyanine cation, aminoanthroquinone cation, azine cation, rhodamine cation, fushin cation, xanthene cation, and combinations thereof. The light-absorbing dyes are incorporated into the patterning formulations depending on technology application, from optical densities (O.D.) of 0.05/micron up to 4/micron, at either a preferred wavelength maximum, or over a broad wavelength maxima range, depending on the light blocking requirements of the film.

Examples of useful cationic dye species include cationic cyanine dyes according to Formula 25 and Formula 26:

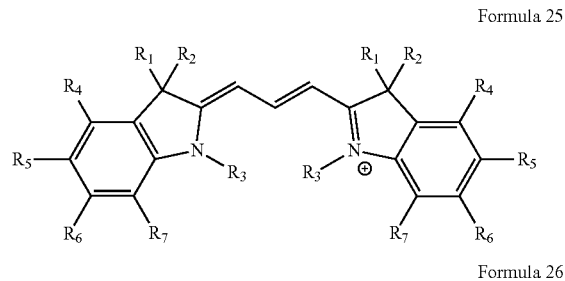

Formula 25

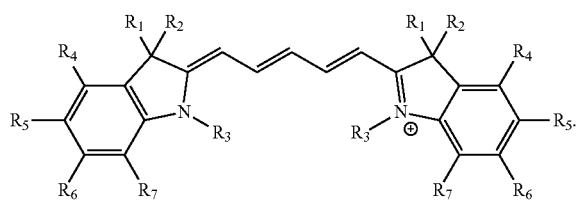

Formula 26

In Formulas 25 and 26, $R_1$ and $R_2$ may be independently H or any alkyl or isoalkyl group such as methyl, ethyl, propyl, isobutyl, sec-butyl, and the like. $R_3$, $R_4$, $R_5$, $R_6$ and $R_7$ may be independently H or any $C_1$ to $C_{18}$ alkyl or isoalkyl group, an aromatic (e.g., $C_6H_5$) group, or an aromatic group substituted with one or more $C_1$ to $C_{18}$ alkyl substituents and/or one or more halogen substituents.

The bridge structures between the two aromatic ring structures in Formulas 25 and 26 above can vary in length as shown in Formula 27, Formula 28, and Formula 29. The length of such bridge structure can be varied as a function of synthesis, and confers the required wavelength absorbance needed from the dye structure. The longer the bridge structure, the longer is the wavelength absorbance ($\lambda_{max}$) of the dye structure.

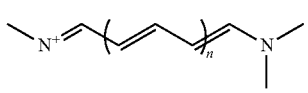

Formula 27 n = 0-8

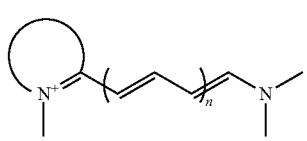

Formula 28 n = 0-8

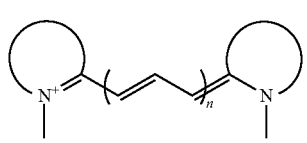

Formula 29 n = 0-8

Additional useful cationic dye species include cationic cyanines of triphenylmethane according to Formula 30, cationic cyanines of thiazines according to Formula 31, and cationic cyanines of oxazines according to Formula 32

Formula 30

Formula 31

Formula 32

In the above Formulas 30-32, each of $R_1$, $R_2$, $R_3$, $R_4$, $R_5$, $R_6$ $R_7$, $R_8$, $R_9$, and $R_{10}$ are independently selected from H, $C_1$-$C_{12}$ alkyl, alkaryl, haloalkyl, thioalkyl, thioalkaryl, haloalkaryl, hydroxyalkyl, hydroxyalkaryl, alkoxy, alkoxyaryl, branched $C_1$-$C_{12}$ polyalkoxy, and branched $C_1$-$C_{12}$ polyalkoxyaryl.

The anionic species $D^-$ of the dye component may be selected, for example, from $SbF_6^-$, $BF_4^-$, $PF_6^-$, $AsF_6^-$, $(CF_3SO_2)_3C^-$, $(CF_3CF_2)_3PF_3^-$, $(C_6F_5)_4B^-$, as well as combinations thereof. As will be appreciated by one of skill in the art, combinations of two, three, four, or more dyes may also be used in the present invention.

According to the invention, the anionic species of the dye component ($D^-$) must be structurally identical to the anionic species of the PAG component ($B^-$), or be of equivalent basicity, such that the acid produced during photolysis is not compromised by the stronger basic counter ion of the dye. As defined herein, "equivalent basicity" means using a dye anion which does not slow lithographic film photospeed beyond that expected from increased film absorbance at 365 nm. Thus, for example, if a hexafluoroantimonate anion is chosen as the anionic species for the photoacid generator, then they dye component must also have hexafluoroantimonate as the anionic species, or its basic equivalent. The dye preferably has an absorbance range from 290 to 1500 nm and corresponds to the wavelengths of light that are to be absorbed. The dye is also transparent in a selected range of wavelengths corresponding to the demands of the application. As defined herein, "transparent" means >70% UV-Visible transmittance. Useful amounts of the ionic dye component in the composition of the invention preferably range from 0.25-50 weight %, and more preferably from 0.5-20 weight %, based on the total weight of the resin components (A) or (B).

In certain embodiments, it is advantageous in include a film flexibilizing compound (M). Suitable flexibilizing compounds (M) include, but are not limited to, caprolactone polyols such as CDR 3314 from King Industries and the C1 to C12 esters of dibasic acids such as dimethyl adipate, dihexyl adipate, dioctyl phthalate and the like.

Alternatively and in certain embodiments, it may advantageous to include a thermal acid generating compound or TAG as an optional component in the composition.

A variety of known TAG compounds may be used for this purpose and examples include CXC 1612, 2,4,4,6-tetrabromocyclohexadienone, benzoin tosylate, 2-nitrobenzyl tosylate and other alkyl esters of organic sulfonic acids. Compounds that generate a sulfonic acid upon thermal activation are generally suitable.

In some embodiments, a quencher may be added to the composition of the invention. The quencher in compositions of the negative-tone composition has two functions. One is to control photospeed at reasonable levels by neutralizing unwanted photo-generated acid, and a second is to counteract the diffusion of photoacid generators. A variety of amines are suitable quenchers, including n-boc-piperidine, t-butyl 4-hydroxy-1-piperidinecarboxylate, triethanol amine, 1-piperidineethanol, and benzyltriethylammonium chloride. Molar ratio of quencher to photoacid generator is preferably from 0.2 to 10.

The negative tone compositions of the invention comprise an alkali soluble, film forming resin (A), a cationic photoinitiator (C) and/or a radical photoinitiator (D); one or more film casting solvents (E), one or more fluorinated compounds (F), and one or more cross linking compounds or resins (G).

The amount of alkali soluble resin (A) that may be used in negative tone compositions of the invention is 5-90 weight % of the total weight of alkali soluble resin component (A), cationic photoinitiator (C) and/or radical photoinitiator (D), cross linking component (G), and, where present, optional resins (I), optional photosensitizers (J) and optional adhesion promoters (K), and more preferably 25-90 weight % and most preferably 40-80 weight %.

The amount of cationic photoinitiator compound (C) that may be used is 0.1 to 10 weight % of the total weight of alkali soluble resin component (A), cationic photoinitiator (C) and/or radical photoinitiator (D), cross linking component (G), and, where present, optional resins (I), optional photosensitizers (J) and optional adhesion promoters (K). It is more preferred to use 1-8 weight % of cationic photoinitiator (C) and it is most preferred to use 2-6 weight %.

The amount of radical photoinitiator compound (D) that may be used is 0.1 to 10 weight % of the total weight of alkali soluble resin component (A), cationic photoinitiator (C) and/or radical photoinitiator (D), cross linking component (G), and, where present, optional resins (I), optional photosensitizers (J) and optional adhesion promoters (K). It is more preferred to use 1-8 weight % of radical photoinitiator (D) and it is most preferred to use 2-6 weight %.

The amount of solvent component (E) that may be used is 5 to 99 weight percent of the total composition. It is more preferred to use 5 to 90 weight percent solvent and most preferred to use 10 to 85 weight %. The exact amount of solvent that is used depends on the desired solution viscosity and coating thickness. Compositions containing lower amounts of solvent provide higher solids concentrations and are useful for preparing thick film while greater amounts of solvent decrease the solids content and such compositions are useful for preparing thin films.

The solvent component (E) may comprise a mixture of two of more solvents.

Solvent mixtures may be used to modify the viscosity and drying characteristics of the composition in a manner that improves coating quality by reducing coating defects such as bubbles and dewets.

The total amount of fluorinated compounds (F) that may be used is 0.01 to 10 weight percent of the sum of alkali soluble resin component (A), cationic photoinitiator (C) and/or radical photoinitiator (D), cross linking component (G), and, where present, optional resins (I), optional photosensitizers (J) and optional adhesion promoters (K), It is more preferred to use 0.5 to 8 weight % of (F) and it is most preferred to use 1 to 5%.

The total amount of cross linking compound (G) that may be used is 1 to 30 weight % of the total weight of alkali soluble resin component (A), cationic photoinitiator (C) and/or radical photoinitiator (D), cross linking component (G), and, where present, optional resins (I), optional photosensitizers (J) and optional adhesion promoters (K) and more preferably 2 to 20 weight % and most preferably 4 to 15 weight %.

The total amount of optional surfactant (H) that may be used is 0.001 to 5 weight percent of the sum of alkali soluble resin component (A), cationic photoinitiator (C) and/or radical photoinitiator (D), cross linking component (G), and, where present, optional resins (I), optional photosensitizers (J) and optional adhesion promoters (K), It is more preferred to use 0.01 to 1 weight % of (H) and it is most preferred to use 0.05 to 0.5%.

When an optional resin (I) is used, the amount of resin I that may be used is 5 to 40 weight % of the total weight of alkali soluble resin component (A), cationic photoinitiator (C) and/or radical photoinitiator (D), cross linking component (G), and, where present, optional resins (I), optional photosensitizers (J) and optional adhesion promoters (K), and more preferably 10 to 30 weight % and most preferably 15 to 30 weight %.

When used, optional photosensitizer component (J) may be present in an amount that is 0.05 to 4.0 weight % relative to the weight of cationic photoinitiator component (C) and/or radical photoinitiator (D) and it is more preferred to use 0.5 to 3.0 weight % and most preferred to use 1 to 2.5 weight %.

When an optional adhesion promoter (K) is used, the amount of (K) that may be used is 0.1 to 3 weight % of the total weight of alkali soluble resin component (A), cationic photoinitiator (C) and/or radical photoinitiator (D), cross linking component (G), and, where present, optional resins (I), optional photosensitizers (J) and optional adhesion promoters (K), more preferably 0.5 to 2,5 weight % and most preferably 1 to 2.5 weight %.

When an optional light absorbing compound (L) is used, the amount of (L) that may be used is 0.25 to 50 weight % of the weight of alkali soluble resin components (A) and more preferably 0.5 to 20 weight %.

The positive tone compositions of the invention comprise one or more alkali insoluble, film forming resins or polymers that become soluble in alkali solutions by action of an acid (B), a cationic photoinitiator (C); one or more film casting solvents (E), and one or more fluorinated compounds (F). In addition to components (B), (C), (E) and (F), the positive tone compositions according to the invention may optionally comprise one or more of the following additive materials: one or more surfactants (H); one or more optional resins (I); one or more photosensitizers (J); one or more adhesion promoters (K); and one or more light absorbing compounds including dyes and pigments (L). In addition to components (B), (C), (E) and (F), and (H) through (L) inclusively, the compositions according to the invention can also optionally comprise additional materials including, without limitation, flow control agents, thermoplastic and thermosetting organic polymers and resins, and inorganic filler materials.

The amount of alkali insoluble resin (B) that may be used in negative tone compositions of the invention is 5-90 weight % of the total weight of alkali soluble resin component (B), cationic photoinitiator (C), and, where present, optional resins (I), optional photosensitizers (J) and optional adhesion promoters (K), and more preferably 10-90 weight % and most preferably 15-80 weight %.

The amount of cationic photoinitiator compound (C) that may be used is 0.1 to 10 weight % of the total weight of alkali in soluble resin component (B), cationic photoinitiator (C), and, where present, optional resins (I), optional photosensitizers (J) and optional adhesion promoters (K). It is more preferred to use 0.1-8 weight % of cationic photoinitiator (C) and it is most preferred to use 1-6 weight %.

The amount of solvent component (E) that may be used is 5 to 99 weight percent of the total composition. It is more preferred to use 5 to 90 weight percent solvent and most preferred to use 10 to 85 weight %. The exact amount of solvent that is used depends on the desired solution viscosity and coating thickness. Compositions containing lower amounts of solvent provide higher solids concentrations and are useful for preparing thick film while greater amounts of solvent decrease the solids content and such compositions are useful for preparing thin films.

The solvent component (E) may comprise a mixture of two of more solvents.

Solvent mixtures may be used to modify the viscosity and drying characteristics of the composition in a manner that improves coating quality by reducing coating defects such as bubbles and dewets.

The total amount of fluorinated compounds (F) that may be used is 0.01 to 10 weight percent of the sum of alkali insoluble resin component (B), cationic photoinitiator (C), and, where present, optional resins (I), optional photosensitizers (J) and optional adhesion promoters (K). It is more preferred to use 0.5 to 8 weight % of (F) and it is most preferred to use 1 to 5%.

The total amount of optional surfactant (H) that may be used is 0.001 to 5 weight percent of the sum of alkali insoluble resin component (B), cationic photoinitiator (C), and, where present, optional resins (I), optional photosensitizers (J) and optional adhesion promoters (K), It is more preferred to use 0.01 to 1 weight % of (H) and it is most preferred to use 0.05 to 0.5%.

When an optional resin (I) is used, the amount of resin I that may be used is 5 to 40 weight % of the total weight of alkali insoluble resin component (B), cationic photoinitiator (C), (G), and, where present, optional resins (I), optional photosensitizers (J) and optional adhesion promoters (K), and more preferably 10 to 30 weight % and most preferably 15 to 30 weight %.

When used, optional photosensitizer component (J) may be present in an amount that is 0.05 to 4.0 weight % relative to the weight of cationic photoinitiator component (C) and it is more preferred to use 0.5 to 3.0 weight % and most preferred to use 1 to 2.5 weight %.

When an optional adhesion promoter (K) is used, the amount of (K) that may be used is 0.1 to 3 weight % of the total weight of alkali insoluble resin component (B), cationic photoinitiator (C), and, where present, optional resins (I), optional photosensitizers (J) and optional adhesion promoters (K), more preferably 0.5 to 2.5 weight % and most preferably 1 to 2.5 weight %.

When an optional light absorbing compound (L) is used, the amount of (L) that may be used is 0.05 to 50 weight % of the weight of alkali insoluble resin components (A) and more preferably 0.1 to 20 weight %.

When an optional flexibilizing compound (M) is used, the amount of (M) that may be used is 1 to 70 weight % of weight of alkali insoluble resin components (A) and more preferably 10 to 30 weight %.

In addition, optional inorganic fillers such as barium sulfate, barium titanate, silicon oxide, amorphous silica, talc, clay, magnesium carbonate, calcium carbonate, aluminum oxide, zinc oxide, aluminum hydroxide, montmorillonite clays, single-walled carbon nanotubes, multi-walled carbon nanotubes, graphene nanoparticles, and mica powder and various metal powders such as silver, aluminum, gold, iron, CuBiSr alloys, and the like can be used in the present invention. The content of inorganic filler may be 0.1 to 80 weight % of the composition. Likewise, organic fillers such as polymethylmethacrylate, rubber, fluoropolymers, cross-linked epoxies, polyurethane powders and the like can be similarly incorporated. When used, organic filler materials are not soluble in solvent component (E).

When necessary, various materials such as thermoplastic resins, coloring agents, and thickening agents can be used in the present invention. Polyether sulfone, polystyrene, polycarbonate, and the like are cited as examples of thermoplastic resins; phthalocyanine blue, phthalocyanine green, iodine green, crystal violet, titanium oxide, carbon black, naphthalene black, and the like are cited as examples of coloring agents; asbestos, orben, bentonite, and montomorillonite are cited as examples of thickening agents. When these additives and the like are used, their general content in the composition of the present invention is 0.05 to 10 weight % each, but this can be increased or decreased as needed in accordance with the application objective.

The resin composition of the present invention can be prepared by combining components (A) through (G) and optional components (H) though (L) and when necessary, inorganic filler and other additives, preferably at the above-mentioned ratios, mixing uniformly, dissolving, dispersing, and the like with a roll mill, paddle mixer, or similar devices known in the compounding art. It is particularly preferred that components (A) through (L) exclusive of solvent component E are diluted with solvent component (E) and adjusted to a viscosity appropriate to the intended use of the composition.

When using the photoimageable compositions of the present invention, the compositions may be applied to a hydrophobic substrate using coating methods such as slot coating, doctor bar coating, roller coating, dip coating, gravure printing, screen printing, and the like. Alternatively, the photoimageable compositions may be applied to the substrate by spin-coating, consisting of dispensing the liquid composition onto a substrate, accelerating the substrate to a constant rotational speed, and holding the rotation speed constant to achieve the desired coating thickness. Spin-coating may be performed with variable rotational velocity in order to control the thickness of the final coating. After coating, a drying bake is performed to evaporate the solvent. The drying bake conditions are chosen so as to form a film of photoresist and typical conditions are 1 minute at 65° C. followed by 5-10 minutes at 95° C. on a hotplate wherein the substrate is in contact or near contact with the surface of the hotplate. Alternatively, the drying bake may be performed in a convection oven and typical conditions are 65 to 95° C. for 3 to 15 minutes.

The solid photoresist coating can then be photolihographically patterned or exposed using exposure tools providing actinic rays in the form of UV, e-beam, and x-ray radiation. It is preferred to use exposure tools providing 300-500 nm UV radiation from medium- or high-pressure mercury lamps or UV diodes through a photomask containing a pattern of opaque and transparent regions. Contact, proximity, or projection exposure modes may be used. Photoimageable compositions containing cationic photoinitiators require a bake operation (post exposure bake or PEB) be performed after exposure in order to accelerate the cationic cross linking or deprotection reactions in the exposed regions of the coating. Photoimageable compositions containing radical photoinitiators do not requiring a post exposure bake in their processing but, their image-wise processing may benefit from use of a post exposure bake. Typical post exposure bakes are carried out on a hotplate for 1 minute at 65° C. and 5 minutes at 95° C.

A relief image of the photomask in the coating is formed by a developing process wherein the coated substrate is immersed in an aqueous alkali developer solution in order to dissolve the soluble regions of the coating. The aqueous alkaline developing solutions suitable for use in the invention may be selected from a group consisting of 0.5 to 5% by weight aqueous solutions of a substance providing an alkaline solution and these substances may be, for example, tetramethylammonium hydroxide, sodium or potassium carbonate, sodium or potassium metasilicate, or sodium or potassium hydroxide. The aqueous alkaline developing solutions may further comprise additives including surfactants and water miscible organic compounds such as alcohols, amines, and alkanol amines as well as water miscible organic solvents such as NMP, DMF, and DMSO.

Aqueous solutions of tetramethylammonium hydroxide are particularly preferred. Typical immersion conditions are 2-5 minutes of contact with the developer solution with agitation at room ambient temperature. The contact time with the developer solution will vary depending on the thickness of the coating, the solvent strength of the developer solution, and the geometrical characteristics of the relief pattern. The developed image is rinsed by application of a deionized water rinse to remove residual developer. Removal of the residual developer is necessary because the residual developer contains dissolved photoresist components that will form deposits in the relief image if the residual developer is allowed to dry on the substrate.

Optionally, the aqueous alkali developer solution may be applied by spraying using either an atomizing spray nozzle or fine shower-head type spray nozzle. Yet another method of developing the image comprises applying the developer using what is known in the photoresist art as a puddle process wherein the substrate to be developed is placed on a rotating tool head and then an amount of developer solution sufficient to form a standing layer or puddle on the entire substrate area is dispensed onto the substrate and allowed to stand for a defined period of time. After this time, the substrate is rotationally accelerated to spin off the spent developer and then decelerated until rotation stops. This sequence is repeated, if necessary, until a clear relief image is obtained and it is common to use a process wherein two to four developer solution puddles are formed.

Optionally, a post-develop bake may be performed on the resulting image to more fully harden the imaged film.

Substrate materials that can be used for electrowetting device applications are hydrophobic polymers and fluoropolymers such as Teflon® AF (DuPont Company), Cytop® (Asahi Glass Company), and Fluoropel™ 1601 V (Cytonix Corp.) are particularly preferred. However, other substrates commonly encountered in semiconductor and MEMs fabrication can also be used and examples include, but are not limited to, silicon, silicon dioxide, silicon nitride, alumina, glass, glass-ceramics, gallium arsenide, indium phosphide, copper, aluminum, nickel, iron, steel, copper-silicon alloys, indium-tin oxide coated glass, organic films such as polyimide, polyester, and any substrate bearing patterned areas of metal, semiconductor, and insulating materials, and the like.

Optionally, a bake step may be performed on the substrate to remove absorbed moisture prior to applying the photoresist coating.

When compositions according to the invention are applied directly to fluoropolymer layers, it is necessary to avoid heating the fluoropolymer layer at temperatures above the glass transition temperature of the fluoropolymer prior to applying the photoresist composition.

The composition of the invention may also be applied using piezo-electric, thermal, or laser ink jet printers. To use the compositions in a piezo-electric printer, the following steps are performed:

A piezo-electric printer cartridge, e.g., a Dimatix material cartridge model #DMC-11610, is filled by carefully inserting into the fill port the needle from a syringe filled with approximately 1.5 ml of the composition. The material is slowly injected, filling the fluid module. The pressure port of the fluid module and the opening of the jetting modules are aligned and snapped together. The filled cartridge is then allowed to stand at rest for 30 minutes to allow any entrapped air to settle away from the nozzles.

The proper waveform for the solution is selected, and the proper voltage settings for each print head are also selected to achieve the optimal drop velocity for the specific ink composition upon jetting.

The substrates for ink jet printing vary according to the required application, but can include typical semiconductor substrates such as silicon, gallium arsenide, other Group III-IV and Group III-V semiconductors, metals, glass, and ceramics. Flexible substrates can also be used and examples include various plastics such as PET, PETG, PEN, Kapton and Mylar. These substrates may be additionally coated with various metals such as gold, silver, and copper, or various metal oxide compounds such as indium-tin oxide, antimony tin oxide, and titanium dioxide.

Following ink jet deposition of the polymer compositions, the coatings may be cured by exposure to ultraviolet radiation (UV cure). Depending upon the composition and/or the evaporation rate of the solvent system in the composition, UV cured inks may require an additional thermal bake to fully cure the system after the initial exposure. High temperature (>120° C.) curing will also in some cases increase the rate of cure or chemical resistance of the coating.

In additional embodiments, relief patterns formed by ink jet printing using the compositions of the invention may be further subjected to a process known as photo trimming. This process involves exposing the ink jetted patterned substrate with UV light through a high resolution lithographic mask. The photo-trimming process may be used to improve pattern edge acuity for inkjet printed features and may also be used to selectively pattern high resolution features on substrates previously patterned by the inkjet process.

The compositions of the present invention may also be used as substrate bonding adhesives wherein a substrate coated with the composition is brought into contact with a second substrate such that, under suitable conditions of heat and pressure, an adhesive bond is formed between the two substrates. Depending upon the heat and pressure conditions used, this adhesive bond may be either temporary or permanent. In this use, a temporary adhesive bond is an adhesive bond that can be broken by treatment of the bonded substrates with a solvent while a permanent bond is an adhesive bond that is not weakened by solvent treatment.

Relief patterns may be formed in coated layers of the compositions by using imprinting methods. Imprinting is the process of transferring a pattern from a template to a substrate by physical contact. The compositions of the invention may be used in imprinting by coating the composition on a surface and then baking the wet coating to dry the film and provide an imprinting substrate. Next, a template bearing elevated features that may have either micron or submicron size features is brought into physical contact with the imprinting substrate. Pressure is then applied to the template, or to the imprinting substrate, or to both the template and imprinting substrate in a manner that causes the elevated features of the template to penetrate into the bulk of the permanent resist coating composition. The efficacy of the imprinting process may be aided by applying heat to the imprinting substrate to soften the permanent resist coating. The template is then separated from the imprinting substrate to provide a patterned substrate wherein the elevated features of template become recessed images in the permanent photoresist coating. This process is described as microimprinting when the feature size is in the micron range and nanoimprinting when the feature size is less than a micron. The transferred pattern may be fixed into the substrate film by exposing the pattern to UV radiation to initiate cationic polymerization of the photoresist composition and then performing a subsequent bake step to complete polymerization and cross linking of the film. Alternatively and without the use of ultraviolet or other active rays, either before or after separation of the template from the imprinted substrate, the patterned substrate may be heated to a temperature sufficient to activate PAG decomposition and subsequent cationic polymerization and thereby provide the permanent photoresist layer. It is possible to combine the processes of image wise, ultraviolet lithography as described above with image wise imprinting lithography to provide a patterned permanent photoresist coating on a substrate in which some portion of the relief pattern is formed by the photolithographic process and some portion by the imprinting process.

The photoresist compositions of the present invention can be used to manufacture dry film photoresists. To prepare a dry film photoresist, a photoresist composition according to the present invention is applied to a base film material using coating methods such as roller coating, doctor bar coating, slot coating, dip coating, spin coating, gravure coating, and the like. The coated base film is then dried in a drying oven set at 60 to 160° C. for a time sufficient to remove the desired amount of solvent. A cover film is then applied to the photoresist side of the coated film to protect the film from damage and to prevent sheets of coated material from sticking together. The thickness of the photoresist on the base film may be adjusted to about 1 to about 100 μm by suitable selection of solvents, photoresist solids content and coating parameters. Organic polymer film materials such as polyethylene terephthalate, polypropylene, and polyimide can be used as the base film. and organic polymers such as polyethylene, polypropylene, and polyethylene terephthalate can be used as the cover sheet material.

The dry film photoresist is used by first peeling the protective cover sheet from the photoresist layer, placing the dry film on a substrate with the photoresist side in contact with the substrate, laminating the photoresist to the substrate by application of heat and pressure using a lamination device and then peeling the base film from the photoresist. These operations result in forming a photoresist layer on the substrate which may be subsequently processed image-wise using the methods described herein.

The photoresist compositions according to the invention have excellent imaging characteristics and the cured products have excellent chemical resistance to solvents, alkalis, and acids and show good thermal stability and electrical properties.

EXAMPLES

The present invention is further described in detail by means of the following Examples and Comparisons. All parts and percentages are by weight and all temperatures are degrees Celsius unless explicitly stated otherwise.
General Experimental Procedures for Preparation and Testing of Formulated Compositions
General Formulation Method for Composition Examples 1 through 10 and Comparative Example 1.

All compositions according to the invention were prepared by individually weighing the components of the compositions into amber glass bottles. The bottle was tightly capped and then rolled on a roller mill until all components were completely dissolved. The samples were allowed to equilibrate to room temperature and were evaluated without further manipulation.

The chemical or trade names, sources, and identifying codes of the substances used to prepare the compositions of the Examples of the invention are listed in Table 1.
Method for Preparing Fluoropolymer Substrates Teflon® AF coated fluoropolymer substrates were prepared by spin coating Teflon AF 1600 solution (DuPont Company) on <100> silicon wafers and then baking the wet coating at 135° C. for 90 seconds on a hotplate. The resulting coatings had a thickness of 0.5 μm and a water contact angle of 122° (sessile drop method).

Cytop® coated fluoropolymer substrates were prepared by spin coating Cytop CTX-809SP2 solution (Asahi Glass Company) on <100> silicon wafers and then baking the wet coating at 90° C. on a hot plate for either 60 seconds or 180 seconds. The resulting coatings had a thickness of 1.3 μm and a water contact angle of 116° (sessile drop method).
Method and Scale for Adhesion Evaluation The adhesion of lithographic patterns made using the compositions of the invention was evaluated using a numeric ranking scale as follows:

| Adhesion Scale Rank Value | Description of Adhesion Behavior |
|---|---|
| 1 | Substantially all of the patterned features fall of the coated substrate during processing. |
| 2 | A small portion of the patterned features adhere to substrate but most fall off during processing. |
| 3 | Small pattern features fall off during processing, large features retained, stress and coating defect related adhesion failures may occur. |
| 4 | Patterns intact but stress and coating defect related adhesion failures may occur. |
| 5 | Patterns intact with no stress or coating defect related adhesion failures observed. |

Method for Measuring Film Thickness

Film thickness measurements were performed using either a FilmTek optical film thickness gauge or by calibrated line measurements using a scanning electron microscope.

TABLE 1

List of Material Identities, Material Sources, Material Functions, and Compositional Use.

| Material | Supplier | Function | Formulation Component Type |
|---|---|---|---|
| NC 6300 EATA | Nippon Kayaku. | Film Forming Resin | A |
| PMGI | MicroChem Corp | Film Forming Resin | A |
| EC1074 | Designer Molecules Inc. | Film Forming Resin | A |
| SD-1 502 | Borden Chemical | Film Forming Resin | A |
| BMR | Nippon Kayaku | Film Forming Resin | A |
| GSID26-1 | BASF | PAG | C |
| Cyracure 6974 (Mixed aryl sulfonium SbF6 salts, 50% solution in propylene carbonate solvent) | Dow Chemical Company | PAG | C |
| Octyloxyphenylphenyl iodonium hexafluoroantimonate (OPPI) | Spectra Group Limited | PAG | C |
| Mixed aryl sulfonium SbF6 salts | San Apro 110A | PAG | C |
| Irgacure 290 | BASF | PAG | C |
| Acetone | Brenntag | Solvent | E |
| Methyl Acetate | Eastman | Solvent | E |
| Propylene carbonate | Sigma-Aldrich | Solvent | E |
| Cyclopentanone | Rhodia | Solvent | E |
| 1,3 Dioxolane | Novalyte | Solvent | E |
| Tetrahydrofurfuryl Alcohol | Penn | Solvent | E |
| 2,3-Dihydro-perfluoropentane | Dupont | Fluorinated Compound | F |
| Novec 7200 | 3M | Fluorinated Compound | F |
| NC 6300H | Nippon Kayaku | Cross Linking Agent | G |
| OXT 221 | Toa Gosei | Cross Linking Agent | G |
| ED 506 (polypropylene glycol diglycidyl ether) | Asahi-Denka | Cross Linking Agent | G |
| SU-8 Epoxy Resin | Momentive Specialty Chemicals | Cross Linking Agent | G |
| Bisphenol A Novolac Epoxy Resin | Nippon Kayaku. | Cross Linking Agent | G |
| EX2177 | Epoxonics | Cross Linking Agent | G |
| Powderlink 1174 | Heraeus | Cross Linking Agent | G |
| PF 7002 | Omnova | Surfactant | H |
| PF 6320 | Omnova | Surfactant | H |
| 2-Ethyl-9,10-dimethoxyanthracene (AN910E) | Spectra Group Limited | Photosensitizer | J |
| 9,10-Dimethoxyanthracene | Sigma Aldrich | Photosensitizer | J |
| 3-glycidoxypropyl-trimethoxysilane | Dow Corning | Adhesion Promoter | K |
| CDR 3314 | King Industries | Flexibilizer | M |

Example 1

A photosensitive epoxy composition containing 57.416% NC6300 EATA (66.8% solution in methyl isobutyl ketone) (Component A), 16.437% NC6300H (Component G), 8.219% OXT-221 (Component G), GSID2601 0.274% (Component C), 16.363% methyl acetate (Component E), 1.285% Novec 7200 (Component F) and 0.005% PF 6320 (Component H) was prepared according to the General Formulation Method.

The composition was coated on a Teflon® AF 1600 fluoropolymer substrate (prepared using the General Method for Preparing Fluoropolymer Substrates) using a motor driven doctor blade apparatus at a coating bar speed of about 20 mm/sec. The wet coating was allowed to stand for 15 minutes and was then dried by baking the coated substrate in a convection oven at 70° C. for 4 minutes followed by cooling to room temperature over a period of 15 minutes. The composition film thickness was 6-7 microns. The film was exposed through a pixel wall pattern mask using 365 nm radiation at a dose of 700 mJ/cm$^2$. The exposed substrate was post-exposure baked at 135° C. for 3 minutes in a convection oven. The latent relief image was developed by immersing the substrate in a 0.26N tetramethylammonium hydroxide solution (TMAH, Rohm & Haas CD 26 developer) at room ambient temperature for 2 minutes followed by rinsing with a stream of DI water (deionized & filtered water) followed by final drying under a gentle stream of flowing air for about 1 minute.

Figure 2A:
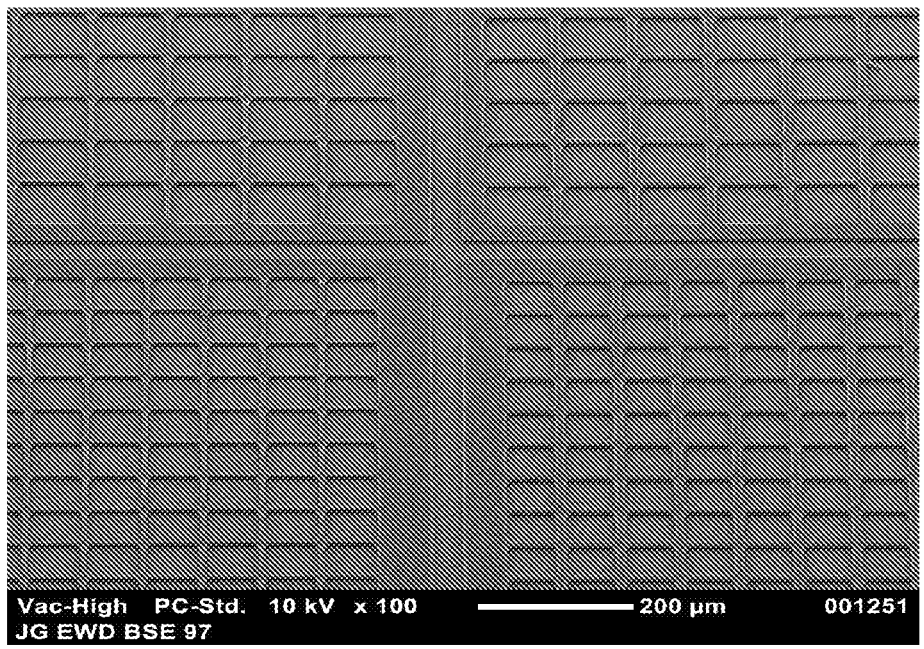
FIG. 2a shows a SEM image of a pixel wall pattern formed on a Teflon® AF surface using a composition and process for using the composition according to the invention.
Figure 2B:
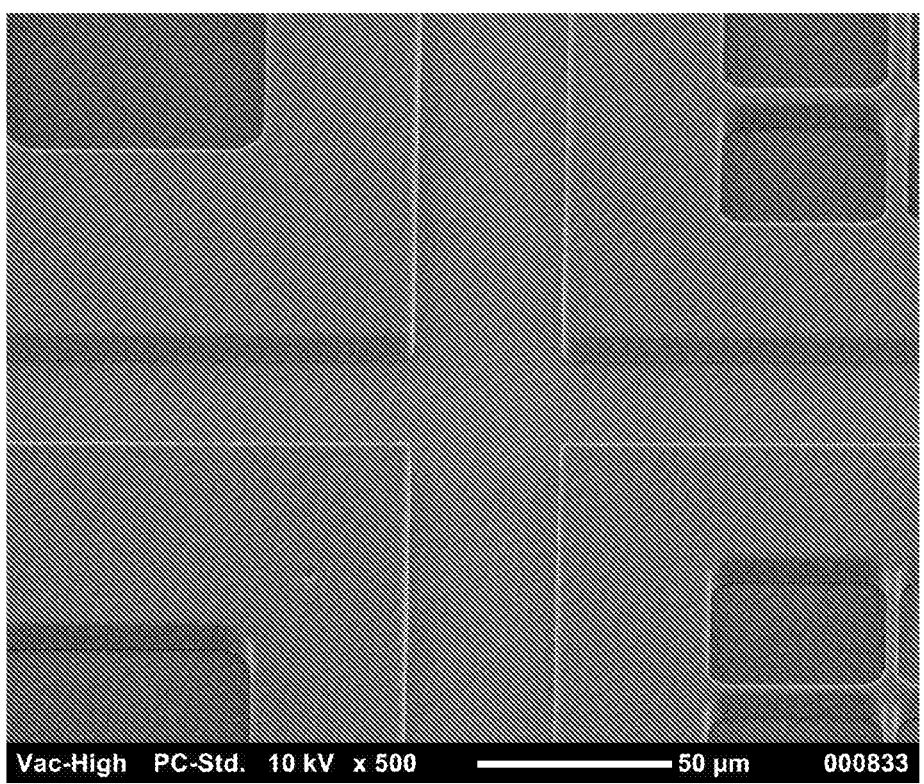

The developed patterns showed excellent lithographic definition with an adhesion scale rank value of 5 as demonstrated in the scanning electron micrograph images shown in FIG. 2a and FIG. 2b.

Example 2

A photosensitive epoxy composition containing 55.150% NC6300 EATA (66.8% assay in methyl isobutyl ketone) (Component A), 15.789% NC6300H (Component G), 7.894% OXT-221 (Component G), Cyracure 6976 5.263% (Component C), 14.610% methyl acetate (Component E), 1.289% Novec 7200 (Component F) and 0.005% PF 6320 (Component H) was prepared according to the General Formulation Method.

The composition was processed on a Teflon® AF coated substrate using the processing conditions described in Example 1 with the exceptions that the exposure dose was 1500 mJ/cm$^2$ The resulting relief pattern showed excellent lithographic definition with an adhesion scale rank value of 5.

Example 3

A photosensitive epoxy composition containing 55.150% NC6300 EATA (66.8% assay in methyl isobutyl ketone) (Component A), 15.789% NC6300H (Component G), 7.894% OXT-221 (Component G), 1.842% OPPI (Component C), 17.241% methyl acetate (Component E), 1.289% Novec 7200 (Component F), 0.005% PF 6320 (Component H), and 0.789% 9,10-dimethoxyanthracene (Component J) was prepared according to the General Formulation Method.

The composition was processed on a Teflon® AF coated substrate using the processing conditions described in Example 1 with the exception that the exposure dose was 15 mJ/cm$^2$.

The resulting relief pattern showed excellent lithographic definition with an adhesion scale rank value of 5.

Example 4

A photosensitive epoxy composition containing 62.558% NC6300 EATA (66.8% assay in methyl isobutyl ketone) (Component A), 17.909% NC6300H (Component G), GSID26-1 0.298% (Component C), 17.829% methyl acetate (Component E), 1.400% Novec 7200 (Component F) and 0.006% PF 6320 (Component H)

The composition was processed on a Teflon® AF coated substrate using the processing conditions described in Example 1 with the exception that the exposure dose was 800 mJ/cm$^2$ The resulting relief pattern showed excellent lithographic definition with an adhesion scale rank value of 5.

Example 5

A photosensitive epoxy composition containing 57.155% NC6300 EATA (66.8% assay in methyl isobutyl ketone) (Component A), 16.363% NC6300H (Component G), 8.181% OXT-221 (Component G), GSID 26-1 0.545% (Component C), 16.464% methyl acetate (Component E), 1.285% Novec 7200 (Component F) and 0.005% PF 6320 (Component H) was prepared according to the General Formulation Method.

The composition was processed on a Teflon® AF coated substrate using the processing conditions described in Example 1 with the exceptions that the exposure dose was 500 mJ/cm$^2$.

The resulting relief pattern showed excellent lithographic definition with an adhesion scale rank value of 5.

Example 6

The composition of Example 1 was processed on a Cytop coated substrate using the processing conditions described in Example 1 with the exceptions that the wet coating bake conditions were 65° C. for 4 minutes.

The resulting relief pattern showed excellent lithographic definition with an adhesion scale rank value of 5.

Example 7

A photosensitive composition containing 17.29% PMGI resin (Component A), 5.18% Powderlink 1174 (Component G), 1.73% CDR 3314 (Component M), 0.61% OPPI (Component C), AN910E 0.17% (Component J), 48.72% Cyclopentanone (Component E), 23.25% 1,3 Dioxolane (Component E), 1.74% Tetrahydrofuryl Alcohol (Component E), 1.29% Novec 7200 (Component F), and 0.02% PF 6320 (Component H) was prepared according to the General Formulation Method.

The composition was processed on a Teflon® AF coated substrate using the processing conditions described in Example 1 with the exception that the exposure dose was 600 mJ/cm$^2$ The resulting relief pattern showed lithographic definition with an adhesion scale rank value of 4.

Example 8

A photosensitive epoxy composition containing 37.60% EC-1074 (Component A), 20.20% EX2177 (Component G), 2.00% San Apro 110A (Component C), 38.87% Methyl Acetate (Component E), 1.29% Novec 7200 (Component F), and 0.04% PF 6320 (Component H) was prepared according to the General Formulation Method.

The composition was processed on a Teflon® AF coated substrate using the processing conditions described in Example 1 with the exception that the exposure dose was 600 mJ/cm2

The resulting relief pattern showed lithographic definition with an adhesion scale rank value of 4.

Example 9

A photosensitive epoxy composition containing 69.17% BMR (70.43% solution in Cyclopentanone—Component A), 4.87% Cyracure 6976 (Component C), 0.37% AN910E (Component J), 5.15% OXT-221 (Component G), 19.15% Methyl Acetate (Component E), and 1.29% Novec 7200 (Component F) was prepared according to the General Formulation Method.

The composition was processed on a Teflon® AF coated substrate using the processing conditions described in Example 1 with the exception that the exposure dose was 100 mJ/cm2

The resulting relief pattern showed lithographic definition with an adhesion scale rank value of 5.

Example 10

A photosensitive composition containing 51.50% Durite SD-1 502 (Component A), 2.58% San Apro 110A (Component C), 10.30% Powderlink 1174 (Component G), 34.33% Acetone (Component E), and 1.29% Novec 7200 (Component F) was prepared according to the General Formulation Method.

The composition was processed on a Teflon® AF coated substrate using the processing conditions described in Example 1 with the exception that the exposure dose was 600 mJ/cm2

The resulting relief pattern showed lithographic definition with an adhesion scale rank value of 5.

Comparative Example 1

A photosensitive epoxy composition containing 57.416% NC6300 EATA (66.8% assay in methyl isobutyl ketone) (Component A), 16.437% NC6300H (Component G), 8.219% OXT-221 (Component G), GSID26-1 0.274% (Component C), 17.648% methyl acetate (Component E), and 0.005% PF 6320 (Component H) was prepared according to the General Formulation Method.

Figure 3:
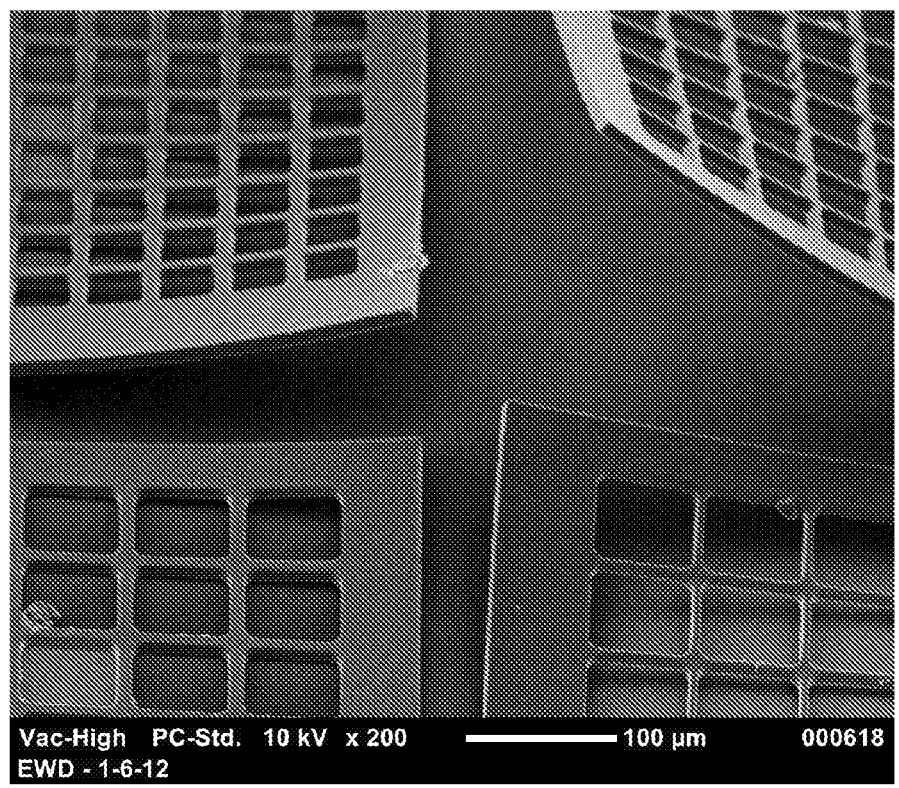
FIG. 3 shows a SEM image of a pixel wall pattern formed on a Teflon® AF surface using a comparative composition wherein major adhesion loss of the composition to the Teflon AF surface has occurred.

The composition was processed on a Teflon® AF coated substrate using the processing conditions described in Example 1. The resulting relief pattern showed good lithographic definition but had an adhesion rank value of 1 showing poor adhesion which is further illustrated in the SEM images shown in FIG. 3. These comparisons demonstrate the necessity of including fluorinated compound Component F in the composition to obtain good adhesion according to the invention.

What is claimed is:

1. A permanent photoimageable composition useful for making permanent photoresist relief patterns on low surface energy polymer substrates comprising:
   (i) one or more alkali soluble, film-forming resins (A) or one or more film forming resins that become soluble in alkali solutions by action of an acid (B); wherein the one or more alkali soluble film forming resins (A) are selected from the group consisting of phenol novolac resins, ortho-cresol novolac resins, para-cresol novolac resins, ortho, para-novolac resins, bisphenol novolac resins, polyhydroxy novolac resins, polyglutarimide resins, phenolic derivatives of C36 dimerdiols, polyester resins synthesized from polyhydric alcohols and polybasic acid compounds, the reaction products of epoxy resins, monocarboxylic acids, and polybasic acid anhydrides, and combinations thereof;
   (ii) a cationic photoinitiator (C), and a radical photoinitiator (D);
      wherein said radical photoinitiator (D) is selected from the group consisting of benzoin ethers, benzoin methyl ethers, diethoxyacetophenone, benzildimethyl ketal, hexaarylbisimidazole, 2-tertbutylanthraquinone, thioxanthone, 2-isopropylthioxanthone, 2-chlorothioxanthone, 2,4,6-trimethylbenzoyldiphenyl phosphine oxide, oxime esters, ketocoumarin derivatives, organotitanocenes, and combinations thereof; and wherein the radical photoinitiator (D) comprises from 0.1-10 wt %, based on the total weight of the composition;
   (iii) one or more film casting solvents (E); and
   (iv) one or more fluorinated compounds (F);
      wherein said fluorinated compound is selected from the group consisting of perfluorohexane, perfluorooctane, perfluorodecalin, 2,3-dihydrofluoropentane, hexafluorobenzene, 1,1,2,2,3,3,4,4-octafluorobutane, perfluorodimethylcyclohexane, perfluoroheptane, perfluoromethylcyclohexane, perfluoropentane, 1-ethoxy-1,1,2,2,3,3,4,4,4-nonafluorobutane, 1,1,1,2,2,3,4,5,5,5-decafluoro-3-methoxy-4-trifluoromethyl-pentane, 3-ethoxy-1,1,1,2,3,4,4,5,5,6,6,6-dodecafluoro-2-(trifluoromethyl)-hexane furan, 2,2,3,4,4,5-hexafluorotetrahydro-3-(pentafluoroethyl)-5-(trifluoromethyl)-cis-furan, 2,2,3,4,4,5-hexafluorotetrahydro-3-(pentafluoroethyl)-5-(trifluoromethyl)-, trans-furan, 2,2,3,4,4,5-hexafluorotetrahydro-5-(pentafluoroethyl)-3-(trifluoromethyl)-trans-furan, 2,2,3,4,4,5-hexafluorotetrahydro-5-(pentafluoroethyl)-3-(trifluoromethyl)-cis-furan, 2,3, 3,4,4,5-hexafluorotetrahydro-2-(pentafluoroethyl)-5-(trifluoromethyl)-, 2h-cyclopenta[b]furan, 2,2,3,3a,4,4,5,5,6,6,6a-undecafluorohexahydro-3-(trifluoromethyl)-furan, 2,2,3,4,4,5-hexafluorotetrahydro-3,5-bis(pentafluoroethyl)-furan, 2,2,3,4,4,5-hexafluoro-3-(heptafluoropropyl)tetrahydro-5-(trifluoromethyl)-furan, 2,2,3,4,4,5-hexafluoro-5-(heptafluoropropyl)tetrahydro-3-(trifluoromethyl)-trans-furan, 2,2,3,4,4,5-hexafluoro-5-(heptafluoropropyl)tetrahydro-3-(trifluoromethyl)-cis-furan, 2,3,3,4,4,5-hexafluoro-2-(heptafluoropropyl)tetrahydro-5-(trifluoromethyl)-, 1,1,1,2,2,3,3,4-nonafluorohexane, perfluoromethylcyclopentane, dodecafluorodimethylcyclobutane, 1h,1h,2h-perfluoro-1-decene, perfluoro-1,3-dimethylcyclohexane, 1h-perfluoroheptane, perfluoroheptene-1,6h-perfluorohexane, perfluoromethyldecalin, perfluorooctene-1, 1h,1h,2h-perfluoro-1-octene, perfluorononane, perfluorodecane, 1,1,1,2,2,3,3,4,4,5,5,6,6-tridecafluoro-6-methoxy-hexane, 2-difluoromethylperfluorooxolane, perfluorotri-n-butylamine/perfluoro-n-dibutylmethylamine mixture; perfluorotributylamine, perfluoro-N-alkylmorpholine, and combinations thereof; and one or more crosslinking compounds.

2. The permanent photoimageable composition of claim 1, wherein the one or more film forming resins that become soluble in alkali solutions by action of an acid are selected from the group consisting of poly(hydroxystyrenes), derivatized copolymers of hydroxystyrene and acrylic monomers, derivatized copolymers and terpolymers of hydroxystyrene, styrene, and acrylic monomers, polymeric resins containing alkyl and alicyclic repeating units, and derivatized copolymers and terpolymers of acrylic monomers, and combinations thereof.

3. The permanent photoimageable composition of claim 1, wherein the cationic photoinitiator is selected from the group consisting of di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium[diphenylsulfide bis-hexafluorophosphate, 4,4'-bis[di((3-hydroxyethoxy)phenylsulfonium[diphenylsulfide bis-hexafluoroantimonate, 4,4'-bis[di((3-hydroxyethoxy)(phenylsulfonium)diphenyl sulfide-bishexafluorophosphate 7-[di(p-tolyl)sulfonium[-2-isopropylthioxanthone hexafluorophosphate, 7-[di(p-tolyl)sulfonio-2-isopropylthioxanthone hexafluoroantimonate, 7-[di(p-tolyl)sulfonium[-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenylsulfide hexafluoroantimonate, 4-tert-butylphenylcarbonyl-4'-diphenylsulfonium diphenylsulfide tetrakis(pentafluorophenyl)borate, diphenyl [4-(phenylthio)phenyl[sulfonium hexafluoroantimonate, mixed aromatic sulfonium hexafluoroantimonate salts, tris(4-(4-acetylphenylthio)phenyl)sulfonium tetrakis(pentafluorophenyl)borate, tris(trifluoromethanesulfonyl(methide), benzoin tosylate, t-butylphenyl alpha-(p-toluenesulfonyloxy)-acetate and t-butyl alpha-(p-toluenesulfonyloxy)-acetate, nitrobenzyl esters, s-triazine derivatives 1,1-bis[p-chlorophenyl]-2,2,2-trichloroethane (DDT); 1,1-bis[p-methoxyphenyl]-2,2,2-trichloroethane; 1,2,5,6,9, 1 0-hexabromocyclodecane;1,1 0-dibromodecane; 1,1-bis[p-chlorophenyl]-2,2-dichloroethane; 4,4-dichloro-2-(trichloromethyl)benzhydrol (Kelthane): hexachlorodimethyl sulfone; 2-chloro-6-(trichloromethyl)pyridine; o,o-diethyl-o-(3,5,6-trichloro-2-pyridyl) phosphorothionate;1,2,3,4,5,6-hexachlorocyclohexane; N-(1,1-bi s [p-chlorophenyl]-2,2,2-trichloroethyl)acetamide, tris [2,3-dibromopropyl] isocyanurate; 2,2-bis [p-chlorophenyl] 1,1-dichloroethylene; tris[trichloromethyl]-s-triazine; and their isomers, analogs, homologs, and combinations thereof.

4. The permanent photoimageable composition of claim 1, wherein the film casting solvents are selected from the group consisting of acetone, 2-butanone, 2-pentanone, 3-pentanone, methyl isobutyl ketone, methyl t-butyl ketone, cyclopentanone, cyclohexanone, dipropylene glycol dimethyl ether, tetrahydrofuran, tetrahydrofurfuryl alcohol 1,3-dioxolane, 1,4-dioxane, dimethoxyethane, diglyme, ethyl acetate, butyl acetate, ethylene glycol monobutyl ether acetate, diethylene glycol monomethyl ether acetate, propylene glycol monomethyl ether acetate, gamma-butyrolactone, dimethyl carbonate, diethyl carbonate, propylene carbonate toluene, xylene, 1,2,4,5-tetramethylbenzene, octane, decane, petroleum distillates, and combinations thereof.

5. The permanent photoimageable composition of claim 1, wherein said crosslinking compounds are selected from the group consisting of diethylene glycol diglycidyl ether, propylene glycol diglycidyl ether, polypropylene glycol diglycidyl ether, hexanediol diglycidyl ether, trimethylolpropane triglycidyl ether, pentaerythritol tetraglycidyl ether, trimethylolpropane triglycidyl ether, propylene glycol diglycidyl ether, 3,4-epoxycyclohexylmethyl methacrylate, 3,4-epoxycyclohexylmethyl-3',4'-epoxycyclohexane carboxylate, bisphenol A, bisphenol F, bisphenol S, thiodiphenol, fluorene bisphenol, terpene diphenol, 4,4'-biphenol, 2,2'-biphenol, 3,3',5,5'-tetramethyl-[1,1'-biphenyl]-4,4'-diol, hydroquinone, resorcinol, naphthalenediol, tris-(4-hydroxyphenyl)methane, and 1,1,2,2,-tetrakis(4-hydroxyphenyl)ethane, xylylene dioxetane, bis(3-ethyl-3-oxetanylmethyl) ether, alkoxymethylmelamines, alkoxyamethylglycolurils, alkoxymethylbenzoguanamines, alkoxymethyldiguanamines, melamine or benzoguanamine polymers, 1,6-hexandiol diacrylate, neopentyl glycol diacrylate, ethylene glycol diacrylate, polyethylene glycol diacrylates having 2 to 20 of repeating units, pentaerythritol diacrylate, dipentaerythritol hexacrylate, trimethylolpropane triacrylate, tetramethylolmethane tetraacrylate, methylene bisacrylamide, N-methylolacrylamide, and combinations thereof.

6. The permanent photoimageable composition of claim 5, wherein the crosslinking compound comprises from 1-30 wt %, based on the total weight of the composition.

7. The permanent photoimageable composition of claim 1, further comprising one or more surfactants selected from the group consisting of fluorinated poly(oxetane) polymers, fluorosurfactants and combinations thereof.

8. The permanent photoimageable composition of claim 7, wherein the surfactant comprises from 0.001-5 wt %, based on the total weight of the composition.

9. The permanent photoimageable composition of claim 1, further comprising one or more epoxy resins selected from the group consisting of epoxy cresol-novolac resin with an epoxide equivalent weight of about 195 g/eq.

10. The permanent photoimageable composition of claim 9, wherein the epoxy resin comprises from 5-40 wt %, based on the total weight of the composition.

11. The permanent photoimageable composition of claim 1, further comprising one or more photosensitizer compounds selected from the group consisting of anthracene derivatives, N-alkyl carbazole derivatives, halo-fluorone derivatives, 9,10-dialkoxyanthracenes, 9,10-dimethoxyanthracene, 9,10-diethoxyanthracene, 9,10-dipropoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid, 9,10-dimethoxyanthracene-2-sulfonic acid methyl ester, 9,10-diethoxyanthracene-2-sulfonic acid methyl ester, 9,10-dimethoxyanthracene 2-carboxylic acid, 9,10-dimethoxyanthracene-2-carboxylic acid methyl ester, N-ethyl carbazole, N-ethyl-3-formyl-carbazole, 1,4,5,8,9-pentamethyl-carbazole, N-ethyl-3,6-dibenzoyl-9-ethylcarbazole and 9,9'-diethyl-3,3'-bicarbazole, 5,7-diiodo-3-butoxy-6-fluorone, 3-hydroxy-2,4,5,7-tetraiodo-6-fluorone, and 9-cyano-3-hydroxy-2,3,5,7-tetraiodo-6-fluorone, coumarin derivatives, 2-mercaptobenzimidazole, 2-mercaptobenzothiazole, 1-phenyl 1-5-mercapto-1H-tetrazole, 2-mercapto-4-phenylthiazole, 2-amino-5-mercapto-4-phenylthiazole, 2-amino-4-mercapta-1,3,4-thiazole, 2-mercaptoimidazole, 2-mercapto-5-methyl-1,3,4-thiazole, 5-mercapto-1-methyl-1H-tetrazole, 2,4,6-trimercapto-s-triazine, 2-dibutylamino-4,6-dimercapto-s-triazine, 2,5-dimercapto-1,3,4-thiadiazole,5-mercapto-1,3,4-thiadiazole, 1-ethyl-5-mercapto-1,2,3,4-tetrazole, 2-mercapto-6-nitrothiazole, 2-mercapto-benzoxazole, 4— phenyl-1-2-mercaptothiazole, mercaptopyridine, 2-mercaptoquinoline, 1-methyl-2-mercaptoimidazole, 2-mercapto-(naphthothiazole), and combinations thereof.

12. The permanent photoimageable composition of claim 11, wherein the photosensitizer comprises from 0.05-4 wt %, based on the total weight of the composition.

13. The permanent photoimageable composition of claim 1, further comprising one or more adhesion promotors selected from the group consisting of 3-glycidoxypropyltrimethoxy silane, 3-glycidoxypropyltriethoxysilane, 3-mercaptopropyltrimethoxysilane, vinyltriethyoxysilane, and combinations thereof.

14. The permanent photoimageable composition of claim 13, wherein the adhesion promotor comprises from 0.1-3 wt %, based on the total weight of the composition.

15. The permanent photoimageable composition of claim 1, further comprising one or more light-absorbing compounds selected from the group consisting of 2,4-dihydroxybenzophenone, 2,2',4,4'-tetrahydroxybenzophenone, phenyl salicylate, 4-t-butylphenyl salicylate, ethyl-2-cyano-3,3-diphenylacrylate, 2'-ethylhexyl-2-cyano-3,3-diphenylacrylate, 2-(2-hydroxy-5-methylphenyl)-2H-benzotriazole, 2-(3-t-butyl-2-hydroxy-5-methylphenyl)-5-chloro-2H-benzotriazole, 2,4-dihydroxyazobenzene, 4-methyl-7-diethylamino-1-benzopyran-2-one, diethylthioxanthone, 1-chloro-4-propoxy-thioxanthone, thioxanthone compounds, stilbene compounds, naphthalic acid compounds, and combinations thereof.

16. The permanent photoimageable composition of claim 15, wherein the light-absorbing compound comprises from 0.25-50 wt %, based on the total weight of the composition.

17. The permanent photoimageable composition of claim 1, further comprising one or more light-absorbing compounds having the general structure $C^+D^-$, where $C^+$ is the cationic species and $D^-$ is the anionic species.

18. The permanent photoimageable composition of claim 17, wherein the cationic species is selected from the group consisting of cyanine cation, aminoanthroquinone cation, azine cation, rhodamine cation, fuchsin cation, xanthene cation, and combinations thereof.

19. The permanent photoimageable composition of claim 17, wherein the anionic species is selected from the group consisting of $SbF_6^-$, $BF_4^-$, $PF_6^-$, $AsF_6^-$, $(CF_3SO_2)_3C^-$, $(CF_3CF_2)_3PF_3^-$, $(C_6F_5)_4B^-$, and combinations thereof.

20. The permanent photoimageable composition of claim 1, further comprising one or more flexibilizing compounds selected from the group consisting of caprolactone polyols, dimethyl adipate, dihexyl adipate, dioctyl phthalate and combinations thereof.

21. The permanent photoimageable composition of claim 20, wherein the flexibilizing compound comprises from 1-70 wt %, based on the total weight of the composition.

22. The permanent photoimageable composition of claim 1, further comprising a quencher selected from the group consisting of n-boc-piperidine, t-butyl-4-hydroxy-1-piperidinecarboxylate, triethanol amine, 1-piperidineethanol, benzyltriethylammonium chloride, and combinations thereof.

23. The permanent photoimageable composition of claim 22, wherein the molar ratio of quencher to photoacid generator is from 0.2 to 10.

24. The permanent photoimageable composition of claim 1, wherein the one or more alkali soluble, film-forming resins (A) comprises from 5-90 wt %, based on the total weight of the composition.

25. The permanent photoimageable composition of claim 1, wherein the cationic photoinitiator (C) comprises from 0.1-10 wt %, based on the total weight of the composition.

26. The permanent photoimageable composition of claim 1, wherein the film casting solvent comprises from 5-99 wt %, based on the total weight of the composition.

27. The permanent photoimageable composition of claim 1, wherein the fluorinated compound comprises from 0.01-10 wt %, based on the total weight of the composition.

28. The composition of claim 1, further comprising one or more additional materials including, without limitation, flow control agents, thermoplastic and thermosetting organic polymers and resins, inorganic filler materials, and radical photoinitiators.

* * * * *